(12) United States Patent
Hell et al.

(10) Patent No.: US 11,757,031 B2
(45) Date of Patent: Sep. 12, 2023

(54) POWER TRANSISTOR WITH INTEGRATED SCHOTTKY DIODE

(71) Applicant: Infineon Technologies AG, Neubiberg (DE)

(72) Inventors: Michael Hell, Erlangen (DE); Rudolf Elpelt, Erlangen (DE); Caspar Leendertz, Munich (DE)

(73) Assignee: Infineon Technologies AG, Neubiberg (DE)

( * ) Notice: Subject to any disclaimer, the term of this patent is extended or adjusted under 35 U.S.C. 154(b) by 527 days.

(21) Appl. No.: 16/998,484

(22) Filed: Aug. 20, 2020

(65) Prior Publication Data

US 2022/0059687 A1 Feb. 24, 2022

(51) Int. Cl.
| | |
|---|---|
| *H01L 29/78* | (2006.01) |
| *H01L 29/872* | (2006.01) |
| *H01L 29/16* | (2006.01) |
| *H01L 29/66* | (2006.01) |

(52) U.S. Cl.
CPC ...... *H01L 29/7806* (2013.01); *H01L 29/1608* (2013.01); *H01L 29/66734* (2013.01); *H01L 29/872* (2013.01)

(58) Field of Classification Search
CPC ........... H01L 29/1608; H01L 29/66734; H01L 29/7803–7808; H01L 29/872
USPC ......................................................... 257/77
See application file for complete search history.

(56) References Cited

U.S. PATENT DOCUMENTS

| | | | |
|---|---|---|---|
| 7,285,807 B2 * | 10/2007 | Brar | H01L 27/0605 257/E27.012 |
| 2017/0345891 A1 | 11/2017 | Van et al. | |
| 2020/0058760 A1 | 2/2020 | Joshi et al. | |

* cited by examiner

*Primary Examiner* — Monica D Harrison
(74) *Attorney, Agent, or Firm* — Murphy, Bilak & Homiller, PLLC

(57) ABSTRACT

According to an embodiment of a semiconductor device, the device includes: a plurality of device cells formed in a semiconductor substrate, each device cell including a transistor structure and a Schottky diode structure; and a superjunction structure that includes alternating regions of a first conductivity type and of a second conductivity type formed in the semiconductor substrate. For each transistor structure, a channel region of the transistor structure and a Schottky metal region of an adjacent one of the Schottky diode structures are interconnected by semiconductor material of the first conductivity type without interruption by any of the regions of the second conductivity type of the superjunction structure, the semiconductor material of the first conductivity type including one or more of the regions of the first conductivity type of the superjunction structure.

20 Claims, 18 Drawing Sheets

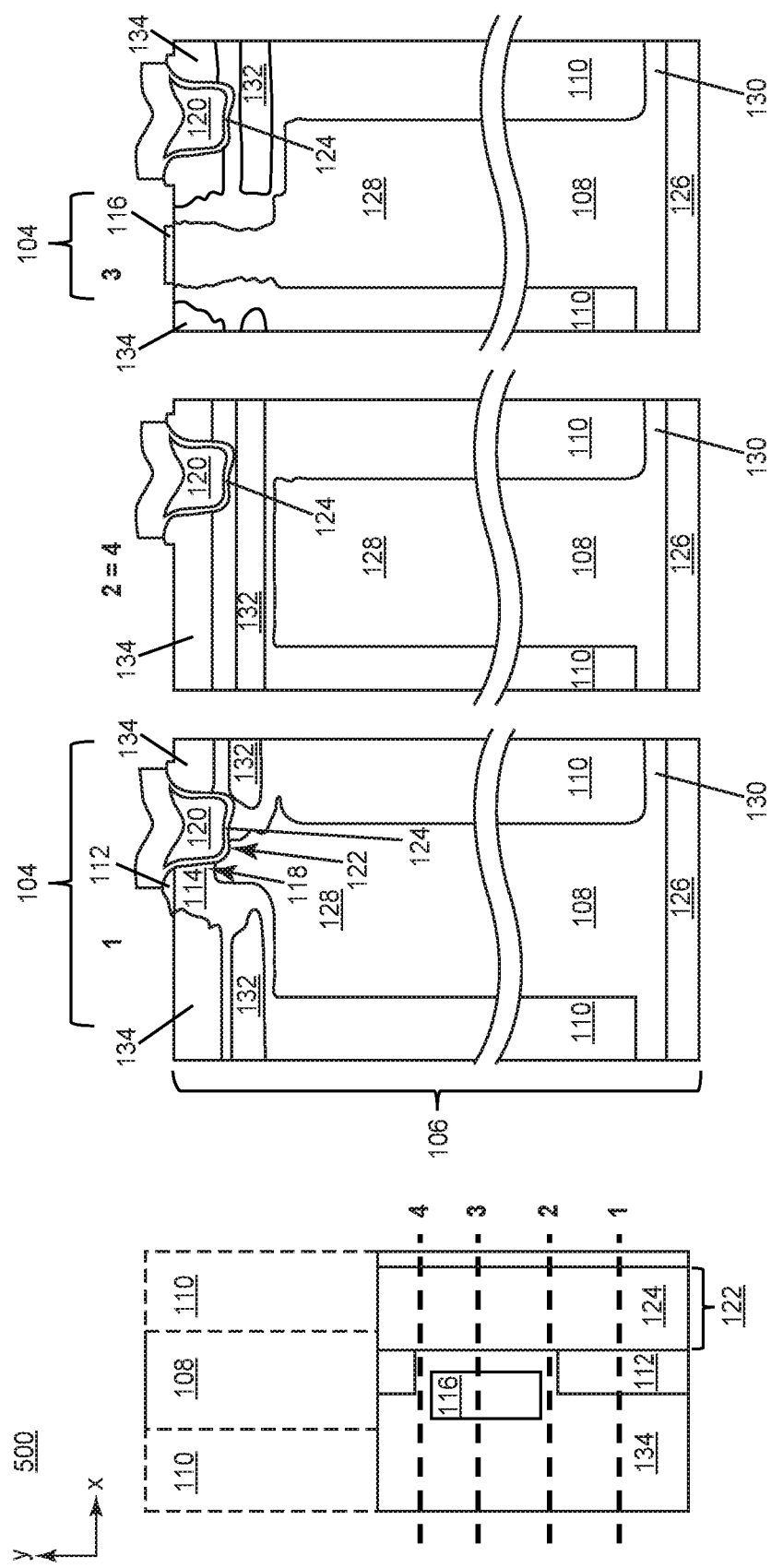

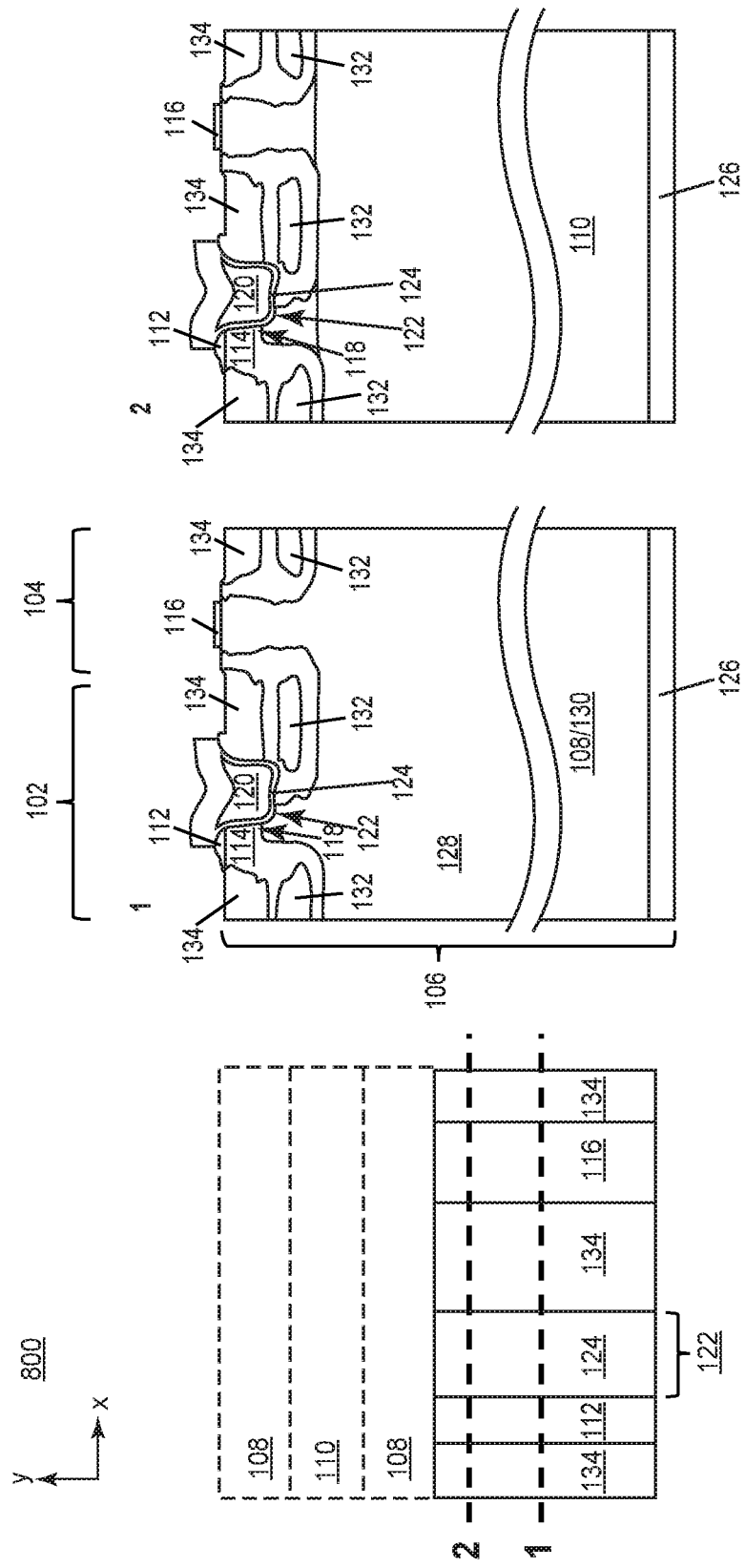

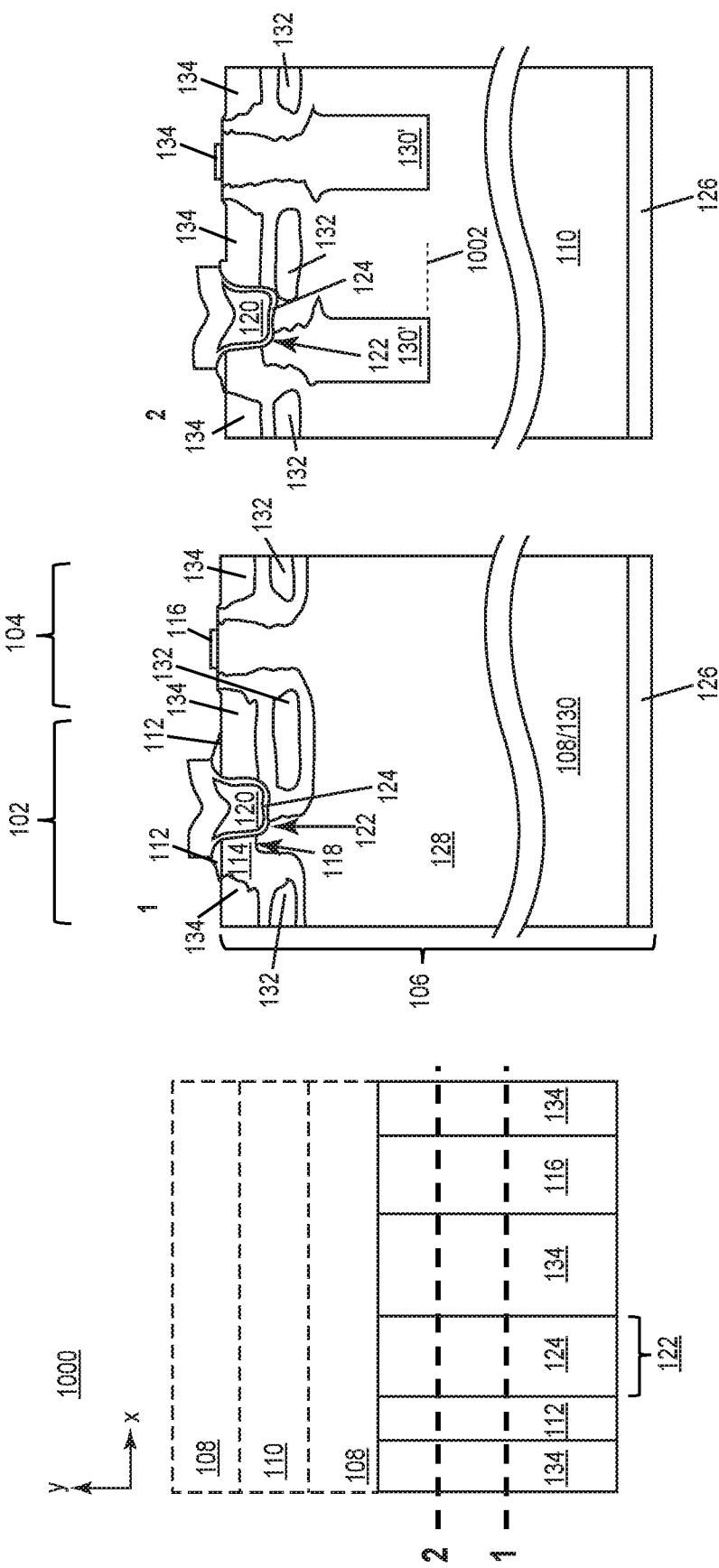

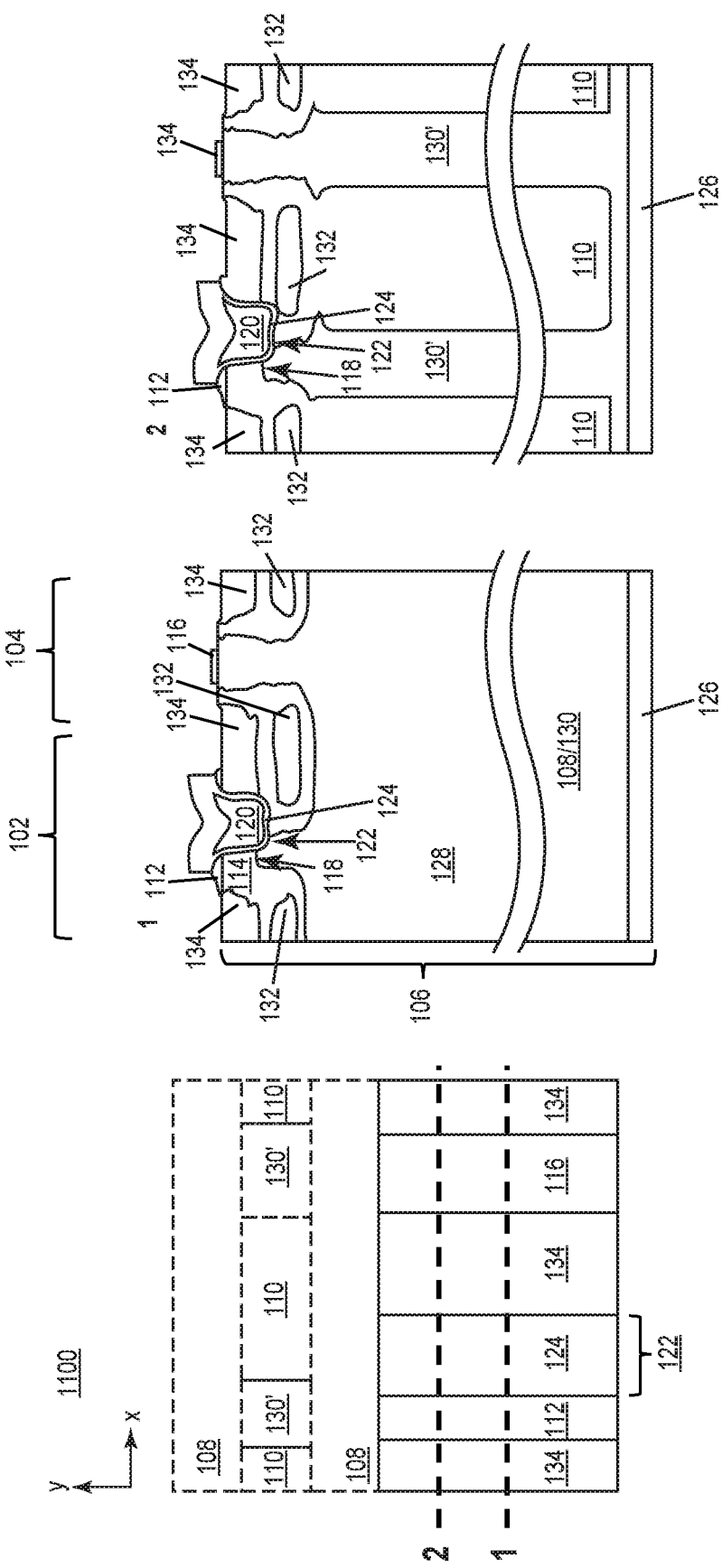

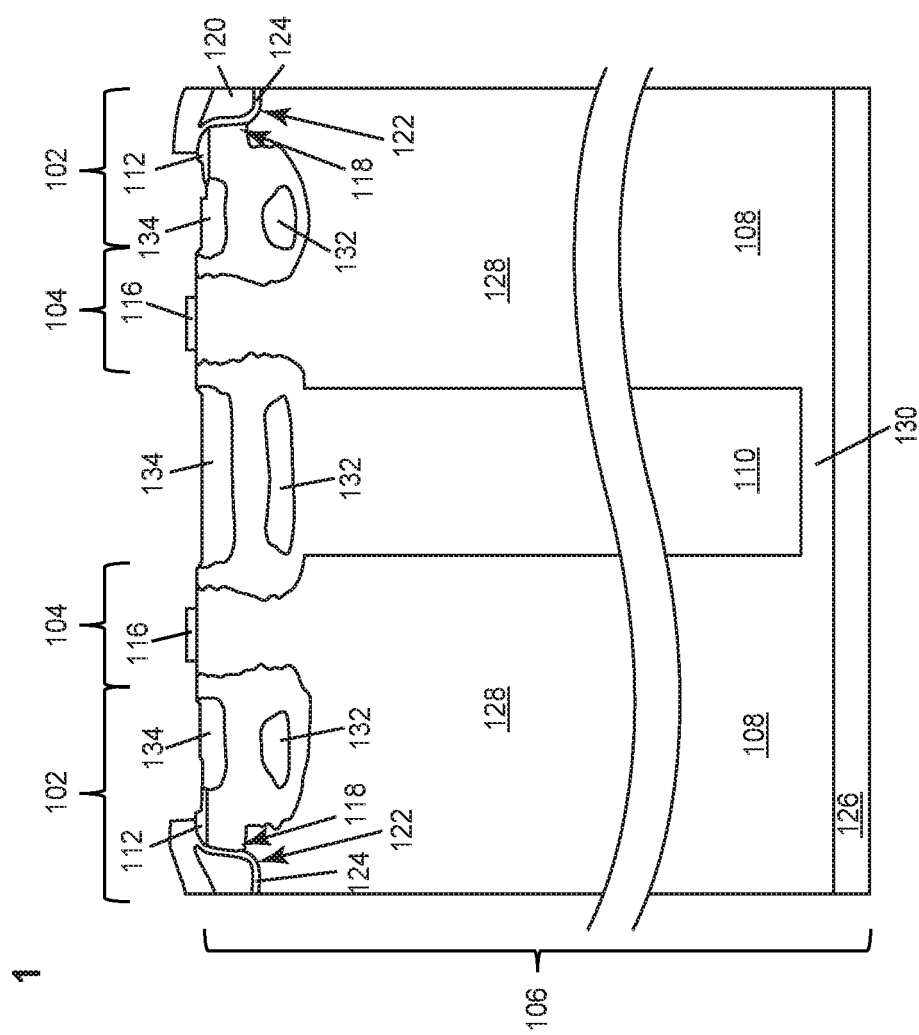
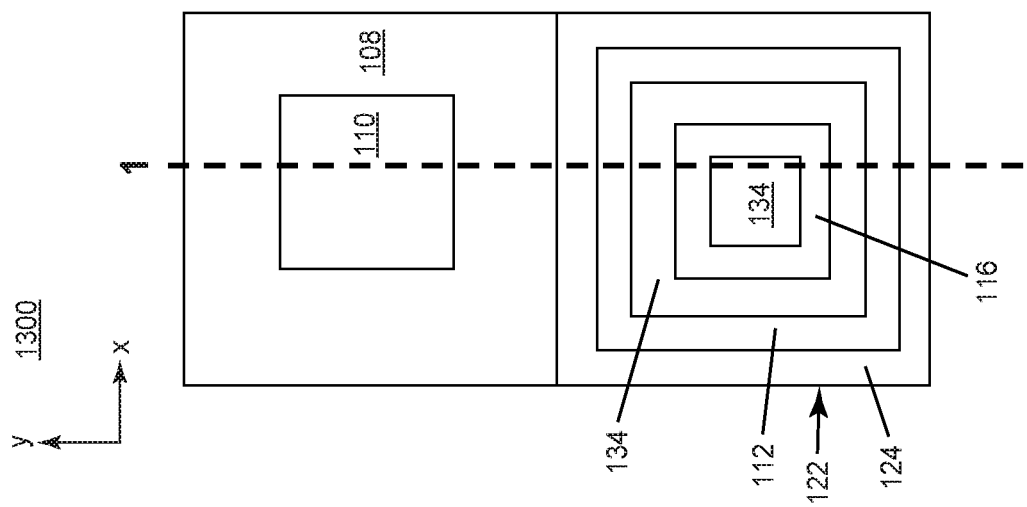
Figure 13B
Figure 13A

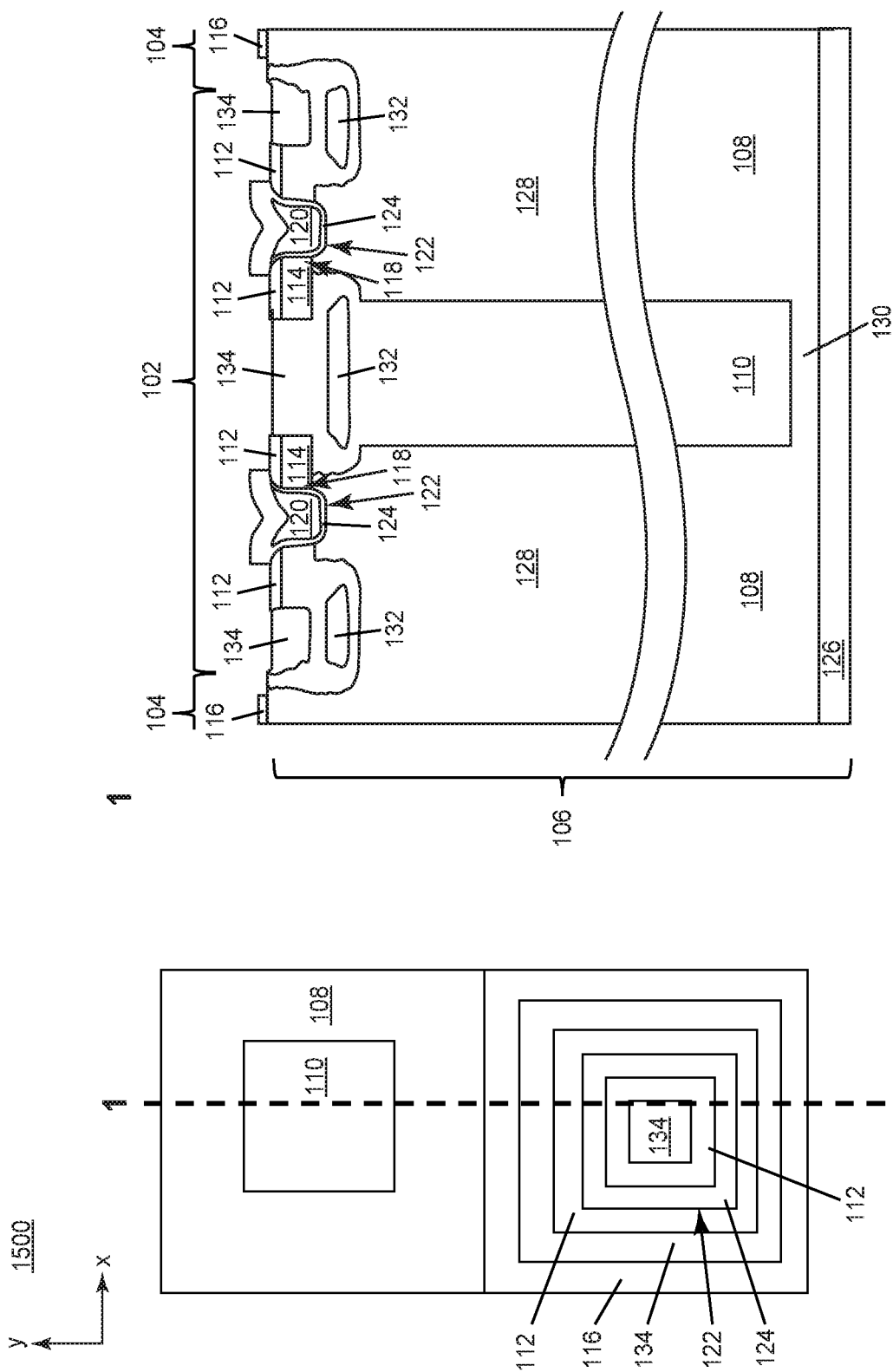

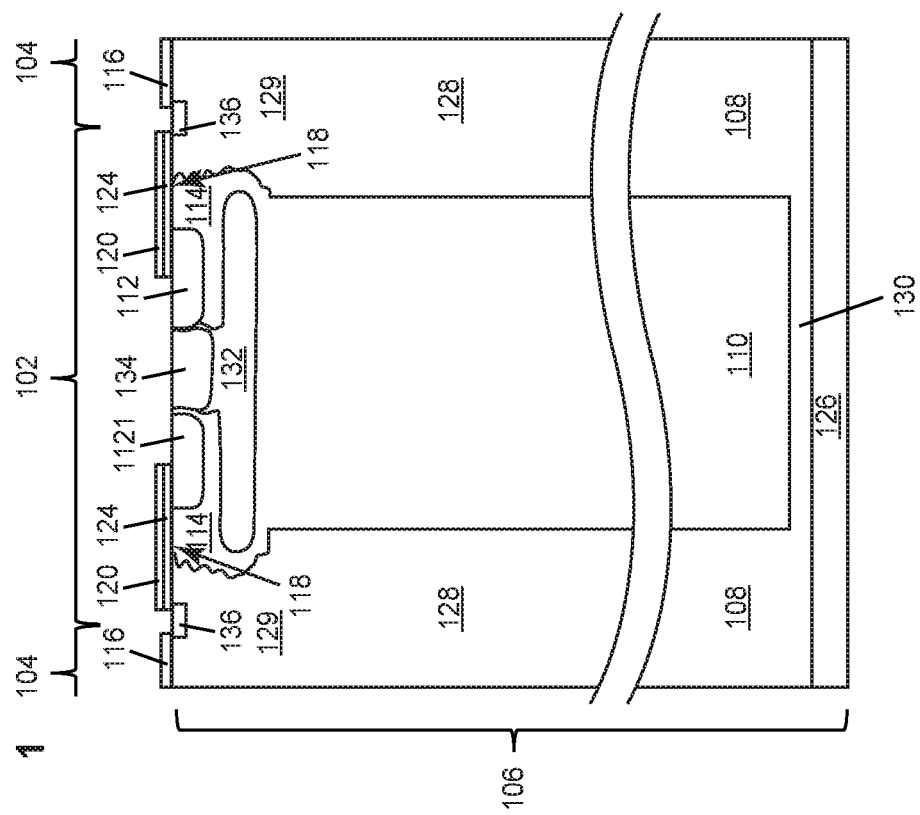
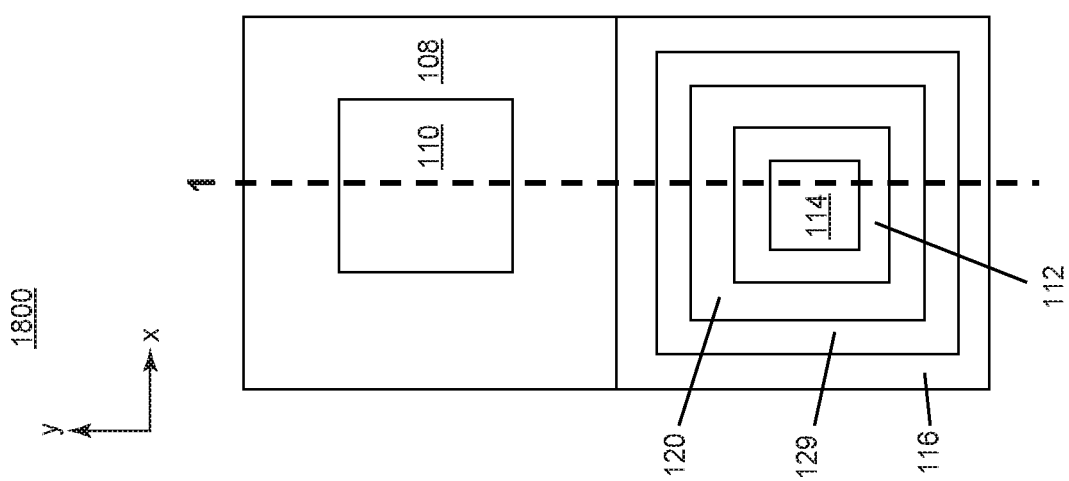

POWER TRANSISTOR WITH INTEGRATED SCHOTTKY DIODE

BACKGROUND

SiC (silicon carbide) power devices are susceptible to bipolar degradation which leads to an increase of resistance over time due to defect growth triggered by electron-hole recombination. This occurs during the bipolar operation of, for example, a SiC power MOSFET (metal-oxide-semiconductor field-effect transistor) when the body diode of the power device is turned on. To avoid bipolar operation, a Schottky diode can be used in parallel with the power MOSFET device. An integrated Schottky diode enables device designs that suppress bipolar turn-on and, furthermore, the required total active area is reduced since the diode and power MOSFET share the same drift-zone layer which is especially attractive for SiC MOSFETs with large blocking voltages (e. g., 3.3 kV or 6.5 kV or higher), for which the drift-zone contribution to the static losses is dominant. However, since the drift-zone doping is rather low for such devices, the performance is somewhat compromised by an additional JFET resistance since the current must spread laterally under p-doped shielding regions to a larger pitch as compared to power MOSFETs with without an integrated Schottky diode.

SiC MOSFETs with large blocking voltages may utilize a superjunction (SJ) structure which substantially reduces the drift-zone resistance. The larger doping of the n-type and p-type conducting pillars of the SJ structure help to reduce the JFET resistance. However, SJ-based SiC MOSFETs still suffer from bipolar degradation. Bipolar operation of an SJ-based SiC MOSFET can be avoided by using an external SiC Schottky diode or any other diode with a threshold voltage below the built-in voltage of about 2.7 V for SiC. This approach is similar to any other standard SiC MOSFET with a lightly doped (n−) drift-zone layer. However, using an external component such as an external SiC Schottky diode increases packaging complexity and overall cost.

Thus, there is a need for an improved SJ-based SiC MOSFETs which are more immune to bipolar degradation.

SUMMARY

According to an embodiment of a semiconductor device, the semiconductor device comprises: a transistor and a Schottky diode integrated in a semiconductor substrate; and a superjunction structure comprising alternating regions of n-type and p-type semiconductor material formed in the semiconductor substrate below a source and a body of the transistor and below a Schottky metal region of the Schottky diode, wherein a channel region that forms in the body of the transistor and the Schottky metal region are interconnected by n-type semiconductor material of the semiconductor substrate without interruption by the p-type regions of the superjunction structure, wherein the n-type semiconductor material that interconnects the channel region and the Schottky metal region comprises the n-type regions of the superjunction structure.

According to another embodiment of a semiconductor device, the semiconductor device comprises: a plurality of device cells formed in a semiconductor substrate, each device cell including a transistor structure and a Schottky diode structure; and a superjunction structure comprising alternating regions of a first conductivity type and of a second conductivity type formed in the semiconductor substrate, wherein for each transistor structure, a channel region of the transistor structure and a Schottky metal region of an adjacent one of the Schottky diode structures are interconnected by semiconductor material of the first conductivity type without interruption by any of the regions of the second conductivity type of the superjunction structure, the semiconductor material of the first conductivity type comprising one or more of the regions of the first conductivity type of the superjunction structure.

Those skilled in the art will recognize additional features and advantages upon reading the following detailed description, and upon viewing the accompanying drawings.

BRIEF DESCRIPTION OF THE FIGURES

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

FIGS. 5A through 11C illustrate partial plan and corresponding cross-sectional views of further embodiments of the semiconductor device and in which the device cells are stripe shaped.

FIGS. 12A through 19B illustrate partial plan and corresponding cross-sectional views of further embodiments of the semiconductor device and in which the device cells are quadratic or hexagonal shaped.

DETAILED DESCRIPTION

Described herein is a semiconductor device having a transistor and a parallel Schottky diode integrated in the same semiconductor substrate. The transistor may have a planar gate or trench gate design. In either case, the semiconductor device also includes a superjunction (SJ) structure comprising alternating regions of n-type and p-type semiconductor material formed in the semiconductor substrate. The superjunction structure enables the device to block its full voltage by balancing additional charge in the drift zone (e.g. n-charge for an n-channel device) by adjacently positioned regions of the opposite conductivity type (e.g. p-type for an n-channel device), allowing for at least two degrees of freedom in setting the on-state resistance and blocking voltage of the device.

The channel of the transistor and the Schottky metal region of the Schottky diode are (electrically) interconnected by semiconductor material of the first conductivity type without interruption by any of the regions of the second conductivity type of the superjunction structure. With such a device construction, total active area is saved by sharing the same drift-zone as compared to a conventional superjunction-based device where the drift zone is not shared between the transistor and the parallel Schottky diode. Also, the bipolar turn-on voltage of the transistor is shifted to larger voltages and the density of holes (for an n-channel device) or electrons (for a p-channel device) is reduced in the upper half of the drift zone in bipolar operation. With increased doping of the n-type and p-type regions of the superjunction structure, JFET (junction FET) resistance due to current spreading in the drift-zone region also is reduced.

Described next in more detail are various embodiments of the superjunction-based semiconductor device with transistor and Schottky diode structures integrated in the same semiconductor substrate.

Figure 1:
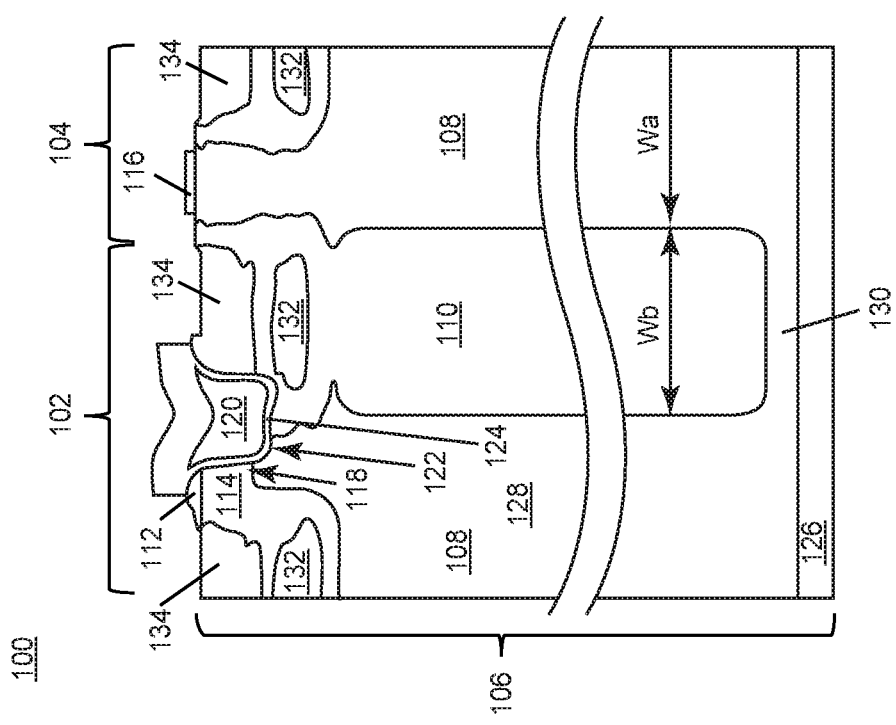
FIG. 1 illustrates a partial cross-sectional view of an embodiment of a semiconductor device having a transistor structure and a Schottky diode structure integrated in the same—semiconductor substrate.

FIG. 1 illustrates a partial cross-sectional view of an embodiment of a semiconductor device 100 having a transistor structure 102 and a Schottky diode structure 104 integrated in the same semiconductor substrate 106. The semiconductor substrate 106 may be a Si (silicon) substrate or a wide-bandgap semiconductor substrate. The term 'wide-bandgap semiconductor' as used herein refers to any semiconductor material having a bandgap greater than 1.5 eV. For example, the semiconductor substrate 106 may comprise SiC (silicon carbide). In another example, the semiconductor substrate 106 may comprise GaN (gallium nitride). Still other wide-bandgap semiconductor materials such as doped diamond may be used for the substrate 106. In each case, the semiconductor substrate 106 may include a base semiconductor and one or more epitaxial layers grown on the base semiconductor.

The semiconductor device 100 also includes a superjunction structure comprising alternating regions 108, 110 of the opposite (first and second) conductivity type formed in the semiconductor substrate 106. In one embodiment, the semiconductor device 100 is a vertical power MOSFET and the superjunction structure is formed below the source 112 and the body 114 of the transistor structure 102 and below a Schottky metal region 116 of the Schottky diode structure 104. The Schottky barrier height depends on the combination of metal and semiconductor materials used to form the rectifying Schottky barrier. For example, the Schottky metal region 116 may comprise Pt, Ti, Ni, Cr, Mo, W, WSi, and/or Au for a SiC or GaN substrate 106. Still other metal and/or metal alloy combinations may be used for the Schottky metal region 116.

The vertical power MOSFET shown in FIG. 1 also includes a channel region 118 that forms in the body 114 of the transistor structure 102 when an appropriate voltage is applied to a gate electrode 120 of the transistor structure 102. In FIG. 1, the gate electrode 120 is disposed in a trench 122 and insulated from the surrounding semiconductor material by a gate dielectric 124. A drain or collector 126 of the vertical power MOSFET is disposed at a side of the semiconductor substrate 106 opposite the source 112.

Current flows vertically between the source 112 and drain/collector 126 through a drift zone 128 of the device 100 when the channel region 118 is present. The transistor structure 102 and the Schottky diode structure 104 are coupled in parallel, and the Schottky diode structure 104 helps to suppress bipolar turn-on of the transistor structure 102. In normal forward operation, electrons flow from the source 112 to the drain 126. In body diode operation, electrons flow from the drain 126 to the source 112. Accordingly, current is carried predominantly by one carrier type (either holes or electrons).

The superjunction structure enables the device 100 to block its full voltage. The superjunction structure may be formed, e.g., by growing multiple epitaxial layers of one conductivity type and forming the SJ columns of the other conductivity type by a masked implantation step. Alternatively, an epitaxial layer may be lowly doped and the SJ columns of either conductivity type are implanted by masks. Still other examples of forming the superjunction structure include an epitaxial re-growth and fill of etched trenches with a p-type epi or using a channeled ion implantation for the creation of deep pillars. A symmetric SJ stripe design may be employed where the width and doping concentrations of the n-doped and p-doped SJ stripes are equal. In each case, the SJ stripes of the same conductivity type as the source 112 are (electrically) interconnected both to the transistor channel region 118 and to the diode Schottky metal region 116.

A balancing of the additional charge provided by a drift zone 128 of the device 100 is achieved by the adjacently positioned superjunction regions 110 of the opposite conductivity type. The drift zone 128 may be considered a part of the superjunction regions 108 of the same conductivity type. For example, in the case of an n-channel device, the drift zone 128 and the first regions 108 of the superjunction structure are n-type and the second regions 110 of the superjunction structure are p-type. In the case of a p-channel device, the drift zone 128 and the first regions 108 of the superjunction structure are p-type and the second regions 110 of the superjunction structure are n-type.

In either case, the channel region 118 of the transistor structure 102 and the Schottky metal region 116 of the Schottky diode structure 104 are (electrically) interconnected by semiconductor material 130 of the same conductivity type without interruption by the oppositely-doped regions 110 of the superjunction structure. This interconnection allows sharing of the drift zone 128 between the transistor structure 102 and the Schottky diode structure 104, which leads to a reduction in total active area and helps to avoid bipolar operation. This is especially beneficial for high voltage applications (e.g., 600V or above).

In FIG. 1, the semiconductor material 130 of the semiconductor substrate 106 that interconnects the channel region 118 of the transistor structure 102 and the Schottky metal region 116 of the Schottky diode structure 104 comprises the first regions 108 of the superjunction structure. For an n-channel device, the source 112, drain/collector 126, drift zone 128, interconnecting semiconductor material 130 and first regions 108 of the superjunction structure would be n-type and the body 114 and second regions 110 of the superjunction structure would be p-type. The Schottky metal region 116 is the anode of the diode 104 and the semiconductor substrate 106 the cathode, for an n-channel device. For a p-channel device, the source 112, drain/collector 126, drift zone 128, interconnecting semiconductor material 130 and first regions 108 of the superjunction structure would be p-type and the body 114 and second regions 110 of the superjunction structure would be n-type. The Schottky metal region 116 is the cathode of the diode 104 and the semiconductor substrate 106 the anode, for a p-channel device.

In either case, charge balance is provided between the oppositely doped semiconductor regions 108, 110 of the superjunction structure to allow for a lower resistance (higher doping) of the drift zone 128. For example, the drift zone 128 may have an average doping concentration of $1e^{16}/cm^3$ to $5e^{17}/cm^3$. Charge balance may be achieved by adjusting the dimensions, shape and/or doping concentrations of the first and second regions 108, 110 of the superjunction structure. In FIG. 1, the SJ pillar design is chosen to be asymmetric where the second regions 110 of the superjunction structure are narrower (width 'wb') than the first regions 110 of the superjunction structure (width 'wa'). For a perfectly charge-balanced device and thus ideal case, the design asymmetry may be balanced by an unequal weighting of the doping concentrations of the first and second regions 108, 110 (Na, Nb) of the superjunction structure such that Nb·wb=Na·wa. If charge imbalance appears, e.g., due to process variations, the device 100 may be designed with some degree of intentional charge imbalance. For example, in a specific horizontal cross-section, Nb·wb may equal Na·wa*f where f is a factor in a range of 0.66 to 1.5, e.g., 0.9 to 1.1. The factor f may depend on the position where the horizontal cut is taken. However, this is only a small charge imbalance, different from the top-cell structure. Here, the p-doping exceeds the n-doping by far, e.g., perhaps by a factor of 10.

The semiconductor device 100 may further include shielding regions 132 and contact regions 134 of the same conductivity type as the second regions 110 of the superjunction structure, that is p-type shielding regions 132 and contact regions 134 for an n-channel device or n-type shielding regions 132 and contact regions 134 for a p-channel device. The shielding regions 132 shield the gate dielectric 124 from excessive electric field potentials. The contact regions 134 are more heavily doped than the shielding regions 132, e.g., to provide ohmic contact to a contact such as metal. As shown in FIG. 1, the shielding regions 132 and contact regions 134 may be vertically aligned with the second regions 110 of the superjunction structure of the same conductivity type. Contacts to the source 112, Schottky metal region 116, gate electrode 120, drain/collector 126, and contact regions 134 are not shown for ease of illustration, but any standard contact structure may be used.

Figure 2:
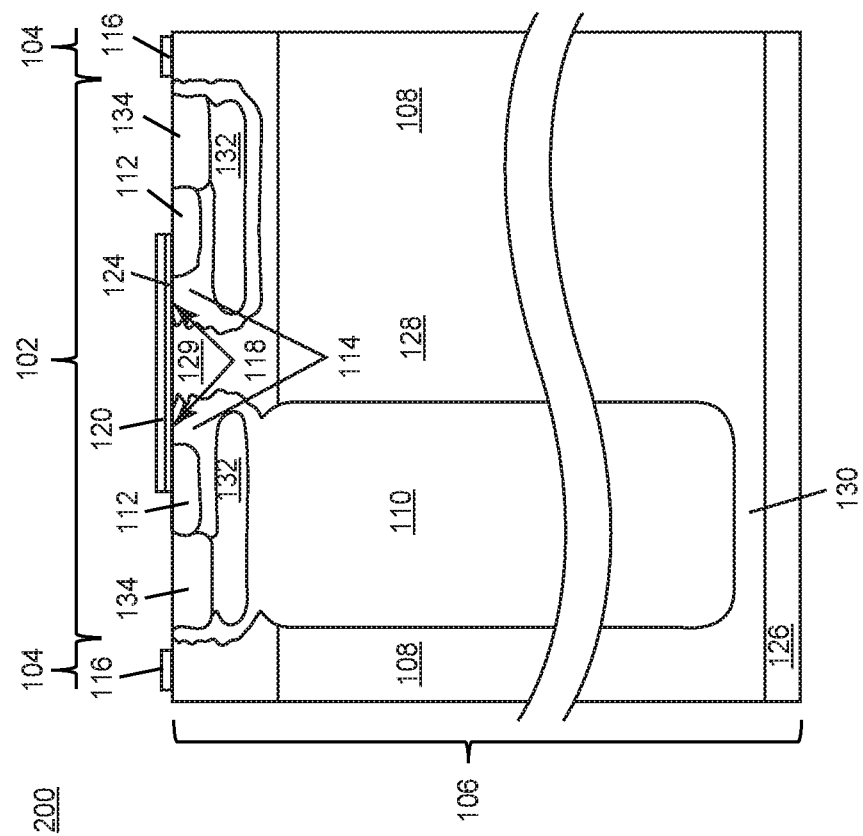
FIG. 2 illustrates a partial cross-sectional view of another embodiment of a semiconductor device having a transistor structure and a Schottky diode structure integrated in the same semiconductor substrate.

FIG. 2 illustrates a partial cross-sectional view of another embodiment of a semiconductor device 200 having a transistor structure 102 and a Schottky diode structure 104 integrated in the same semiconductor substrate 106. The embodiment shown in FIG. 2 is similar to the embodiment shown in FIG. 1. Different, however, the transistor structure 102 is a planar gate transistor with the gate electrode 120 disposed above and insulated from the semiconductor substrate 106 by the gate dielectric 124. Current flows horizontally from the source 112 through the channel region 118 which forms in the body 114 to a current spread region 129 of the same conductivity type as the source 112, and then vertically to the drain/collector 126 through the drift zone 128.

Figure 3:
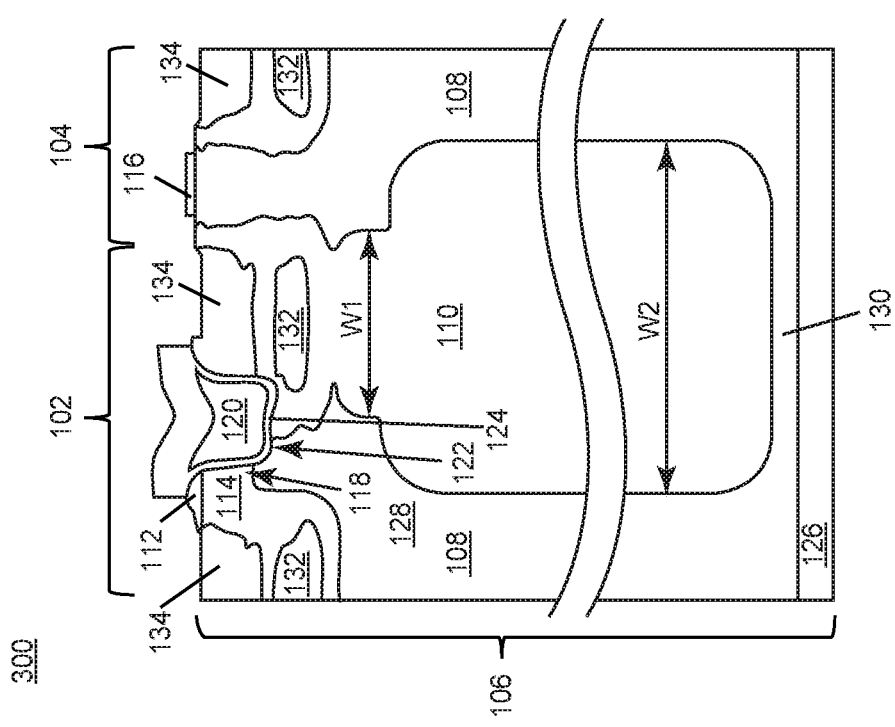
FIG. 3 illustrates a partial cross-sectional view of another embodiment of a semiconductor device having a transistor structure and a Schottky diode structure integrated in the same semiconductor substrate.

FIG. 3 illustrates a partial cross-sectional view of another embodiment of a semiconductor device 300 having a transistor structure 102 and a Schottky diode structure 104 integrated in the same semiconductor substrate 106. The embodiment shown in FIG. 3 is similar to the embodiment shown in FIG. 1. Different, however, the SJ pillar design is symmetric in the lower part of the semiconductor substrate 106 but the second regions 110 of the superjunction structure taper off in the upper part of the substrate 106 so as to connect the second SJ regions 110 to the shielding regions 132. That is, the width of the second regions 110 of the superjunction structure varies in the vertical (current flow) direction. The second regions 110 of the superjunction structure have a smaller width W1 closer to the shielding regions 132 and a larger width W2 deeper in the semiconductor substrate 106. At the wider part W2 of the second regions 110 of the superjunction structure, the first and second regions 108, 110 of the superjunction structure may have the same width. Regardless of the shape of the first and second regions 108, 110 of the superjunction structure, charge balance is maintained between the first and second regions 108, 110 to ensure adequate blocking, e.g., by adjusting the doping concentrations of the first and second regions 108, 110 of the superjunction structure.

Figure 4:
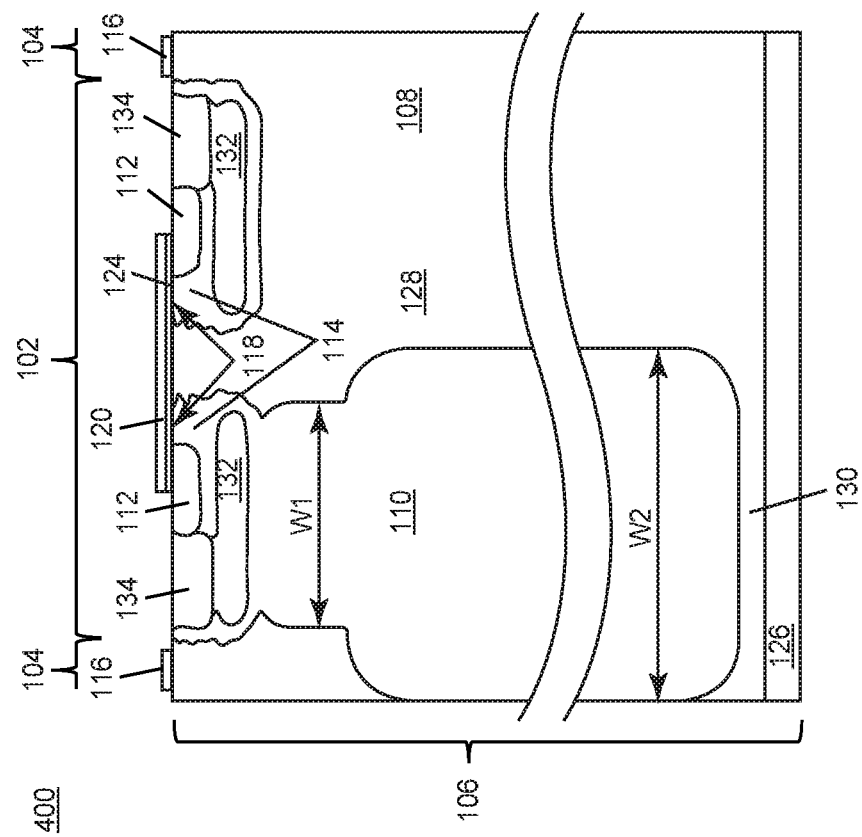
FIG. 4 illustrates a partial cross-sectional view of another embodiment of a semiconductor device having a transistor structure and a Schottky diode structure integrated in the same semiconductor substrate.

FIG. 4 illustrates a partial cross-sectional view of another embodiment of a semiconductor device 400 having a transistor structure 102 and a Schottky diode structure 104 integrated in the same semiconductor substrate 106. The embodiment shown in FIG. 4 is similar to the embodiment shown in FIG. 2 in that the transistor is a planar gate device. However, like the embodiment shown in FIG. 3, the width of the second regions 110 of the superjunction structure varies in the vertical (current flow) direction. As explained above in connection with FIG. 3, the first and second regions 108, 110 of the superjunction structure may have the same width at the wider part W2 of the second regions 110 of the superjunction structure.

The semiconductor devices 100, 200, 300, 400 shown in FIGS. 1 through 4 may include a plurality of device cells formed in the semiconductor substrate 106, where each of FIGS. 1 through 4 show one transistor structure 102 and a neighboring Schottky diode structure 104 of a single device cell. The device cells may be replicated 10s, 100s, 1000s or even more times to form a corresponding transistor and Schottky diode in parallel with the transistor. The transistor may be a power MOSFET as described above, IGBT (insulated gate bipolar transistor), JFET, etc. The device cells may be striped-shaped, quadratic-shaped, hexagonal-shaped, etc. Described next are additional embodiments of various cells types, where in each case and for each transistor structure 102, the channel region 118 of the transistor structure and the Schottky metal region 116 of an adjacent Schottky diode structure 104 are interconnected by semiconductor material 130 of a first conductivity type without interruption by any of the regions 110 of a second conductivity type of the superjunction structure. In the following embodiments, the first conductivity is n-type and the second conductivity type is p-type for an n-channel device and the first conductivity is p-type and the second conductivity type is n-type for a p-channel device.

FIG. 5A illustrates a partial top-down plan view of another embodiment of a semiconductor device 500 having a transistor structure 102 and a Schottky diode structure 104 integrated in the same semiconductor substrate 106. The transistor structure 102 and the Schottky diode structure 104 are part of the same device cell, and the semiconductor device 500 has 10s, 100s, 1000s or even more of the device cells. A single device cell is shown in FIG. 5A for each of illustration. According to this embodiment, the channel region 118 of the stripe-shaped transistor structure 102 and the Schottky metal region 116 of more than one Schottky diode structure 104 are interdigitated within the same semiconductor mesa and the oppositely doped semiconductor regions 108, 110 of the superjunction structure run in parallel (y-direction in FIG. 5A) to the gate trenches 122. The cell layout shown in FIGS. 5A through 5D allows a transistor structure 102 and a Schottky diode structure 104 to share the same SJ stripe/column 108 of the first conductivity type for conduction while at the same time allowing a narrow SJ pitch to be realized.

Part of the top-down plan view in FIG. 5A shows the oppositely doped semiconductor regions 108, 110 of the superjunction structure as dashed boxes, since they are covered and therefore would otherwise be completely out of view in FIG. 5A. FIG. 5B is a cross-sectional view of the semiconductor device 500 taken along the line labeled '1' in FIG. 5A. FIG. 5C is a cross-sectional view of the semiconductor device 500 taken along the lines labeled '2' and '4' in FIG. 5A. FIG. 5D is a cross-sectional view of the semiconductor device 500 taken along the line labeled '3' in FIG. 5A.

According to the embodiment shown in FIGS. 5A through 5D, the transistor structures 102 are stripe shaped and the regions 108 of the first conductivity type of the superjunction structure are also stripe shaped. The stripe-shaped regions 108 of the first conductivity type of the superjunction structure run parallel with the stripe-shaped transistor structures 102 in the y-direction in FIG. 5A. The regions 110 of the second conductivity type of the superjunction structure may also be stripe shaped.

For each stripe-shaped transistor structure 102, the source region 112 of the stripe-shaped transistor structure 102 is interrupted by at least one of the Schottky diode structures 104 along a length (y-direction in FIG. 5A) of the stripe-shaped transistor structure 104 and a single one of the stripe-shaped regions 108 of the first conductivity type of the superjunction structure is disposed below the source region 112 of the stripe-shaped transistor structure 102 and interconnects the channel region 118 of the stripe-shaped transistor structure 102 and the Schottky metal region 116 of each Schottky diode structure included in the same device cell without interruption by any of the regions 110 of the second conductivity type of the superjunction structure.

Figure 6C:
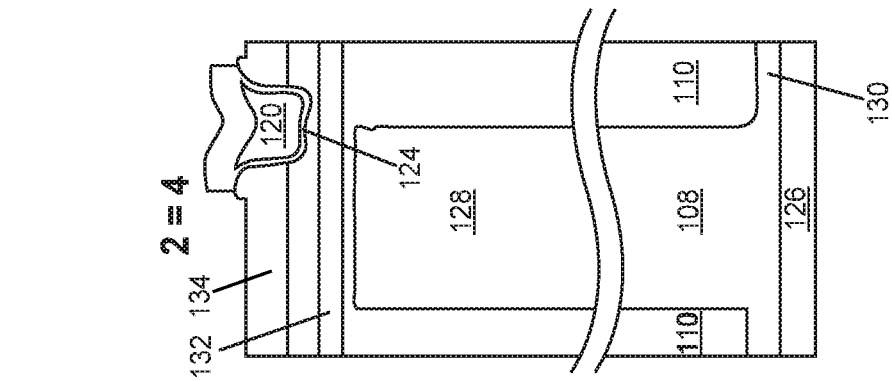
Figure 6B:
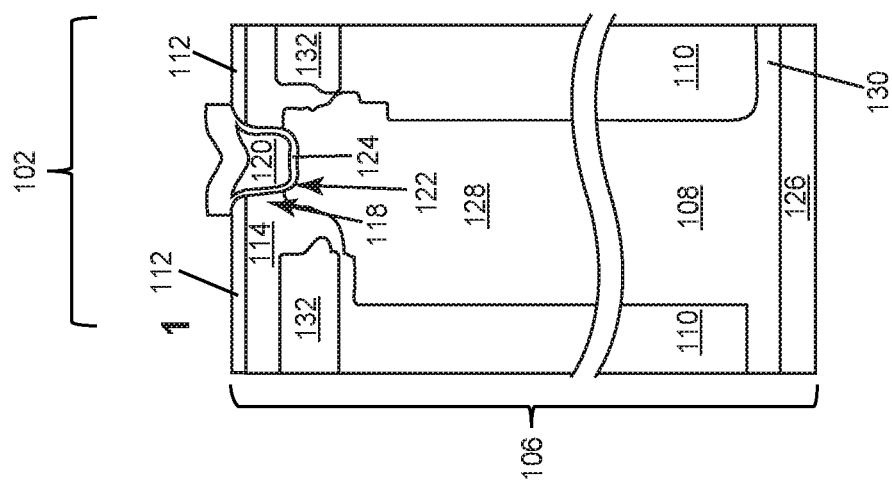
Figure 6A:
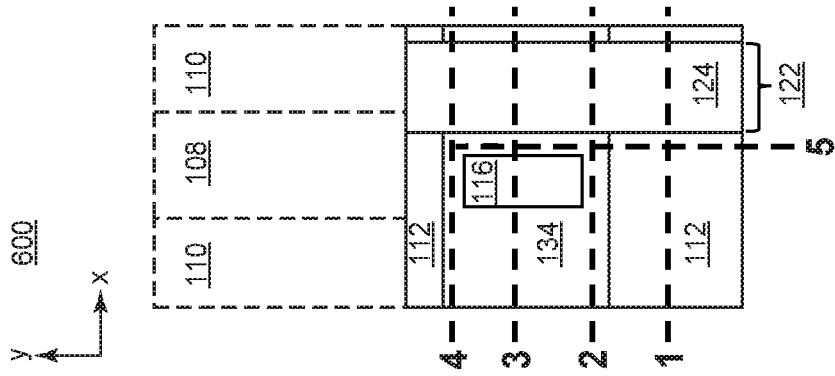
Figure 6E:
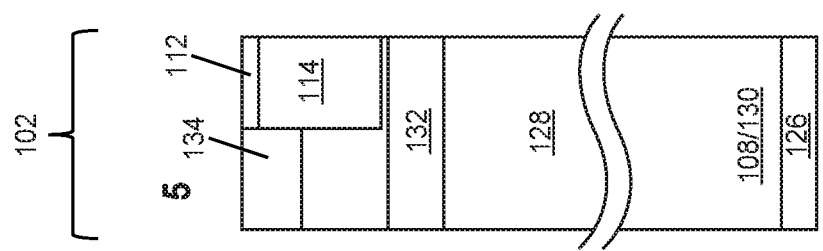
Figure 6D:
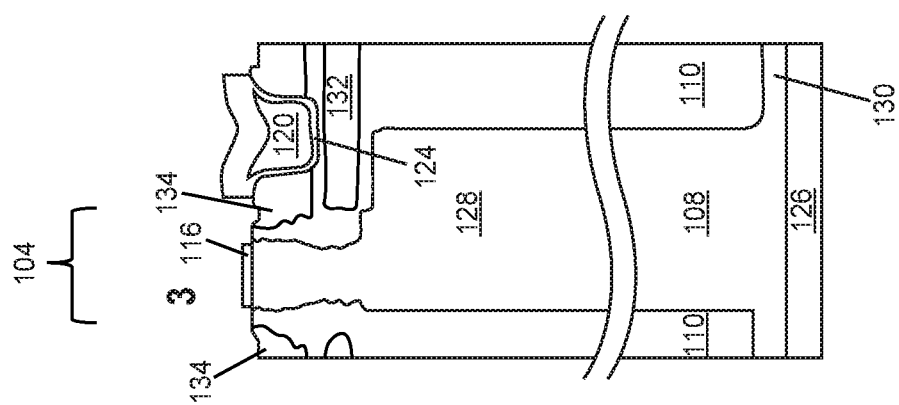

FIG. 6A illustrates a partial top-down plan view of another embodiment of a semiconductor device 600 having a transistor structure 102 and a Schottky diode structure 104 integrated in the same semiconductor substrate 106. FIG. 6B is a cross-sectional view of the semiconductor device 600 taken along the line labeled '1' in FIG. 6A. FIG. 6C is a cross-sectional view of the semiconductor device 600 taken along the lines labeled '2' and '4' in FIG. 6A. FIG. 6D is a cross-sectional view of the semiconductor device 600 taken along the line labeled '3' in FIG. 6A. FIG. 6E is a cross-sectional view of the semiconductor device 600 taken along the line labeled '5' in FIG. 6A.

The embodiment shown in FIGS. 6A through 6E is similar to the embodiment illustrated in FIGS. 5A through 5D. Different, however, the source region 112 extends along both sidewalls of the trench 122 instead of along just one sidewall, thereby providing higher current per device cell. Also, the source regions 112 of the stripe-shaped transistor structures 102 may have a larger dimension measured along a lengthwise extension (x-direction in FIG. 6A) of the stripe-shaped transistor structures 102 than the Schottky metal regions 116 of the Schottky diode structures 104.

Figure 7B:
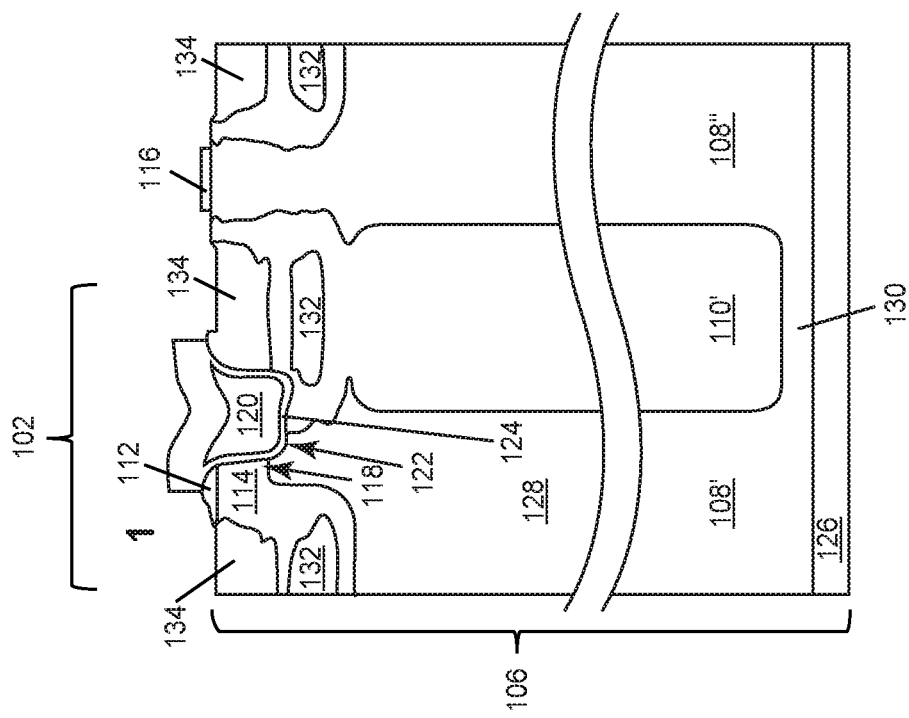
Figure 7A:
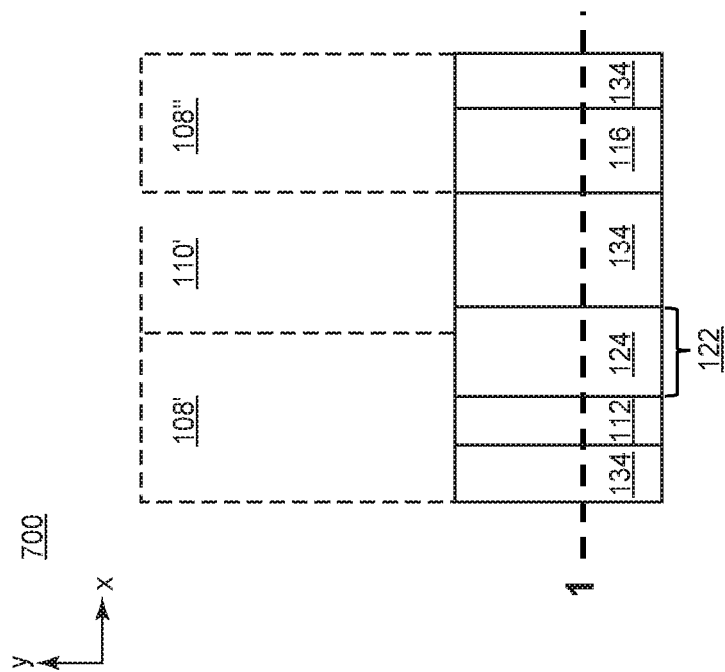

FIG. 7A illustrates a partial top-down plan view of another embodiment of a semiconductor device 700 having a transistor structure 102 and a Schottky diode structure 104 integrated in the same semiconductor substrate 106. FIG. 7B is a cross-sectional view of the semiconductor device 700 taken along the line labeled '1' in FIG. 7A.

The embodiment shown in FIGS. 7A and 7B is similar to the embodiment illustrated in FIGS. 5A through 5D. Different, however, for each stripe-shaped transistor structure 102: at least one of the Schottky diode structures 104 laterally adjoins the stripe-shaped transistor structure 102 instead of interrupting the source region 112. Accordingly, the source region 112 runs uninterrupted along the length (y-direction in FIG. 7A) of the stripe-shaped transistor structure 102 and is separated from the Schottky metal region 116 of each laterally adjoining Schottky diode structure 104 by the gate trench 122.

A first one 110' of the stripe-shaped regions 110 of the second conductivity type of the superjunction structure is interposed between the source region 112 and the Schottky metal region 116 of each laterally adjoining Schottky diode structure 104. A first one 108' of the stripe-shaped regions 108 of the first conductivity type of the superjunction structure is disposed below the source region 112. A second one 108" of the stripe-shaped regions 108 of the first conductivity type of the superjunction structure is disposed below the Schottky metal region 116 of each laterally adjoining Schottky diode structure 104. Further according to the embodiment illustrated in FIGS. 7A and 7B, the first one 108' and the second one 108" of the stripe-shaped regions 108 of the first conductivity type of the superjunction structure (electrically) interconnect the channel region 118 of the stripe-shaped transistor structure 102 and the Schottky metal region 116 of each laterally adjoining Schottky diode structure 104 without interruption by the first one 110' of the regions 110 of the second conductivity type of the superjunction structure, via the interconnecting region 130 of the first conductivity type.

FIG. 8A illustrates a partial top-down plan view of another embodiment of a semiconductor device 800 having a transistor structure 102 and a Schottky diode structure 104 integrated in the same semiconductor substrate 106. FIG. 8B is a cross-sectional view of the semiconductor device 800 taken along the line labeled '1' in FIG. 8A. FIG. 8C is a cross-sectional view of the semiconductor device 800 taken along the line labeled '2' in FIG. 8A.

The embodiment shown in FIGS. 8A through 8C is similar to the embodiment illustrated in FIGS. 5A through 5D. Different, however, the stripe-shaped regions 108 of the first conductivity type of the superjunction structure run transverse (x-direction in FIG. 8A), e.g. perpendicular, to the stripe-shaped transistor structures 104. The regions 110 of the second conductivity type of the superjunction structure may also be stripe shaped and run transverse (x-direction in FIG. 8A) to the stripe-shaped transistor structures 104. The contact density between the transistor channel region 118 and the Schottky metal region 116 of each laterally adjoining Schottky diode structure 104 is limited to only a part of the channel region 118 and each Schottky metal region 116, according to this embodiment.

Further according to the embodiment shown in FIGS. 8A through 8C, and for each stripe-shaped transistor structure 102: at least one Schottky diode structure 104 laterally adjoins the stripe-shaped transistor structure 102 so that the source region 112 runs uninterrupted along the length (y-direction in FIG. 8A) of the stripe-shaped transistor structure 102 and is separated from the Schottky metal region 116 of each laterally adjoining Schottky diode structure 104 by the gate trench 122. The stripe-shaped regions 108 of the first conductivity type of the superjunction structure interconnect the channel region 118 of the stripe-shaped transistor structure 102 and the Schottky metal region 116 of each laterally adjoining Schottky diode structure 104 without interruption by the regions 110 of the second conductivity type of the superjunction structure, via the interconnecting region 130 of the first conductivity type.

Figures 9A, 9B, 9C:
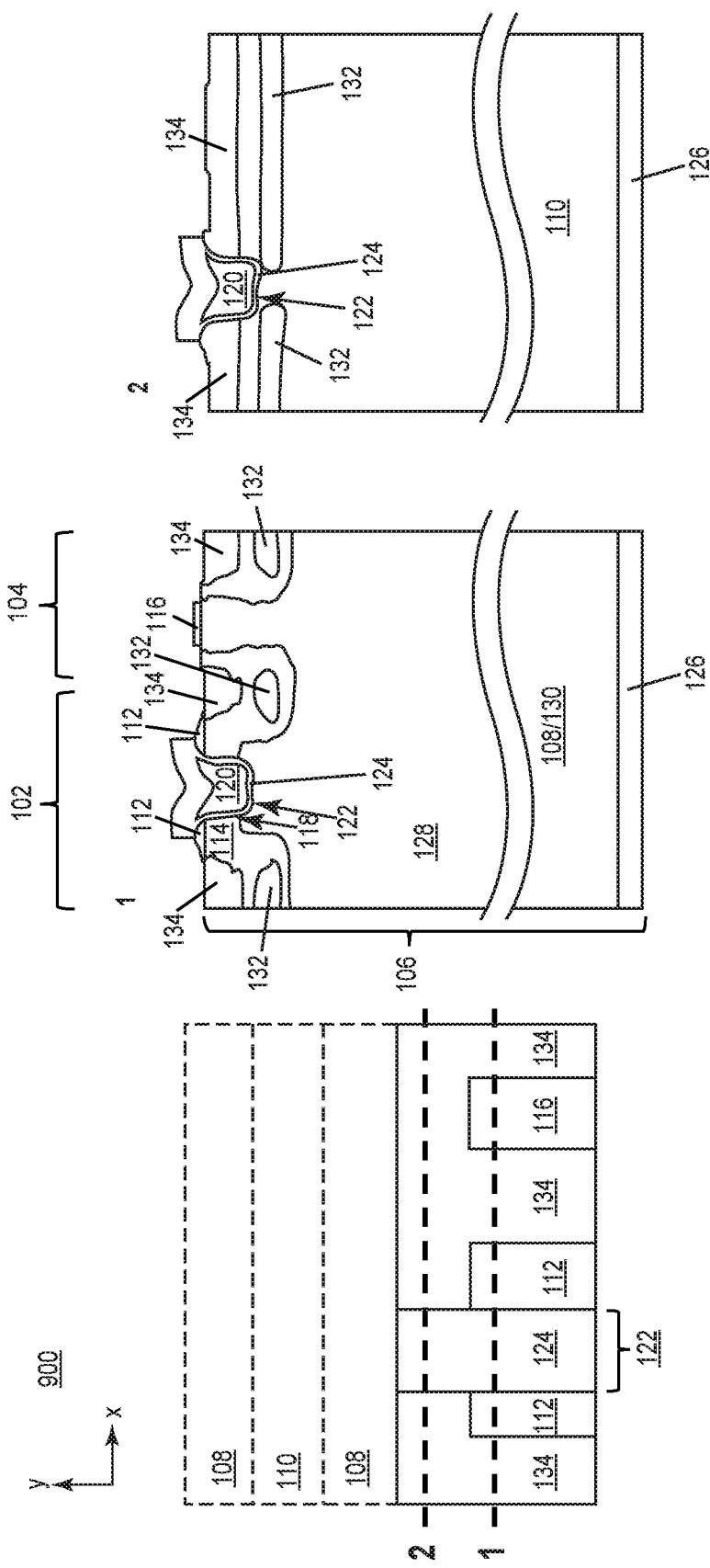

FIG. 9A illustrates a partial top-down plan view of another embodiment of a semiconductor device 900 having a transistor structure 102 and a Schottky diode structure 104 integrated in the same semiconductor substrate 106. FIG. 9B is a cross-sectional view of the semiconductor device 900 taken along the line labeled '1' in FIG. 9A. FIG. 9C is a cross-sectional view of the semiconductor device 900 taken along the line labeled '2' in FIG. 9A.

The embodiment shown in FIGS. 9A through 9C is similar to the embodiment illustrated in FIGS. 8A through 8C. Different, however, and to avoid loss of channel density, the source region 112 of the transistor structure 102 is implemented using a checkerboard design instead of a stripe design. The source region 112 is interrupted along the lengthwise extension (y-direction in FIG. 9A) by semiconductor material 132, 134 of the opposite conductivity type where the striped regions 110 of the second conductivity type of the superjunction structure are formed. Accordingly, the source region 112 is prolonged perpendicular (x-direction in FIG. 9A) to the lengthwise extension of the gate trench 122 such that both trench sidewalls are used for the channel region 118. The contact regions 134 also is widened perpendicular to the trench direction and interrupted in this direction, analogous to the source region 112. To adequately shield the gate dielectric 124, the shielding regions 132 extend along the entire striped regions 110 of the second conductivity type of the superjunction structure, as shown in FIG. 9C. The gate dielectric 124 is thus not only shielded from the side as in FIGS. 8A through 8C, but also from the top and the bottom.

For each stripe-shaped transistor structure 104 implemented according to the embodiment shown in FIGS. 9A through 9C: the source region 112 is disposed along opposing sides of the gate trench 122. The stripe-shaped regions 109 of the first conductivity type of the superjunction structure are disposed below the source region 112 of the stripe-shaped transistor structure 104 and interconnect the channel region 118 of the stripe-shaped transistor structure 102 and the Schottky metal region 116 of each Schottky diode structure 104 of the same device cell without interruption by any of the regions 110 of the second conductivity type of the superjunction structure, via the interconnecting region 130 of the first conductivity type. Further according to this embodiment, the regions 110 of the second conductivity type of the superjunction structure extend to the drain/collector 126 of the semiconductor device 900 at a side of the semiconductor substrate 106 opposite the source regions 112 of the stripe-shaped transistor structures 102.

FIG. 10A illustrates a partial top-down plan view of another embodiment of a semiconductor device 1000 having a transistor structure 102 and a Schottky diode structure 104 integrated in the same semiconductor substrate 106. FIG. 10B is a cross-sectional view of the semiconductor device 1000 taken along the line labeled '1' in FIG. 10A. FIG. 10C is a cross-sectional view of the semiconductor device 1000 taken along the line labeled '2' in FIG. 10A.

The embodiment shown in FIGS. 10A through 10C is similar to the embodiment illustrated in FIGS. 8A through 8C. Different, however, along the length (x-direction in FIG. 10A) of the stripe-shaped regions 108 of the first conductivity type of the superjunction structure, adjacent ones of the stripe-shaped regions 108 of the first conductivity type of the superjunction structure are interconnected by body connecting regions 130' of the first conductivity type which extend through the regions 110 of the second conductivity type of the superjunction structure in a direction transverse (y-direction in FIG. 10A) to the lengthwise extension of the stripe-shaped regions 108 of the first conductivity type of the superjunction structure. The body connecting regions 130' of the first conductivity type are in vertical contact with the body region 114 of the stripe-shaped transistor structures 102, thereby allowing the channel current to reach the stripe-shaped regions 108 of the first conductivity type of the superjunction structure. The channel current has a vertical component in cross-section '2' of FIG. 10C and a lateral or horizontal component in cross-section '1' of FIG. 10B. Further as shown in FIG. 10C, the regions 110 of the second conductivity type of the superjunction structure are stripe shaped and extend deeper into the semiconductor substrate 106 than the body connecting regions 130' of the first conductivity type and are uninterrupted by the body connecting regions 130' of the first conductivity type below a termination point 1002 of the body connecting regions 130'.

FIG. 11A illustrates a partial top-down plan view of another embodiment of a semiconductor device 1100 having a transistor structure 102 and a Schottky diode structure 104 integrated in the same semiconductor substrate 106. FIG. 11B is a cross-sectional view of the semiconductor device 1100 taken along the line labeled '1' in FIG. 11A. FIG. 11C is a cross-sectional view of the semiconductor device 1100 taken along the line labeled '2' in FIG. 11A.

The embodiment shown in FIGS. 11A through 11C is similar to the embodiment illustrated in FIGS. 10A through 10C. Different, however, the body connecting regions 130' of the first conductivity type extend deeper into the semiconductor substrate 106 than the regions 110 of the second conductivity type of the superjunction structure such that each region 110 of the second conductivity type of the superjunction structure is segmented into a plurality of laterally spaced-apart pillars along the lengthwise extension (x-direction in FIG. 11A) of the stripe-shaped regions 108 of the first conductivity type of the superjunction structure. Accordingly, the region 110 of the second conductivity type of the superjunction structure is interrupted by the body connecting regions 130' of the opposite conductivity type and therefore have more of a pillar-like shape than a stripe shape. An additional advantage of this design is that no Schottky contact area needs to be sacrificed in contrast to the latter design.

The embodiments of FIGS. 8A-8C and 11A-11C may be combined such that directly below the channel 112 and Schottky metal regions 118, the region 110 of the second conductivity type of the superjunction structure is interrupted. In this case, no channel and diode area is sacrificed. At the same time, pillar-like regions 110 of the second conductivity type are provided only in the upper part of the semiconductor substrate 106 but the deeper part of the substrate 106 may make use of complete stripes of the second conductivity type, e.g., as shown in FIGS. 10A-10C.

According to the embodiment shown in FIGS. 5A through 11C, the transistor structures 102 and the regions 108 of the first conductivity type of the superjunction structure are each stripe shaped. The regions 110 of the second conductivity type of the superjunction structure may also be stripe shaped, as shown in FIGS. 5A through 11C.

Described next are further embodiments of various cells types, where in each case the transistor structures 102 have a quadratic or hexagonal shape and the Schottky metal region 116 of the Schottky diode structures 104 is disposed at a center or a periphery of the device cell. In the following embodiments, the first conductivity is n-type and the second conductivity type is p-type for an n-channel device and the first conductivity is p-type and the second conductivity type is n-type for a p-channel device.

Figure 12B:
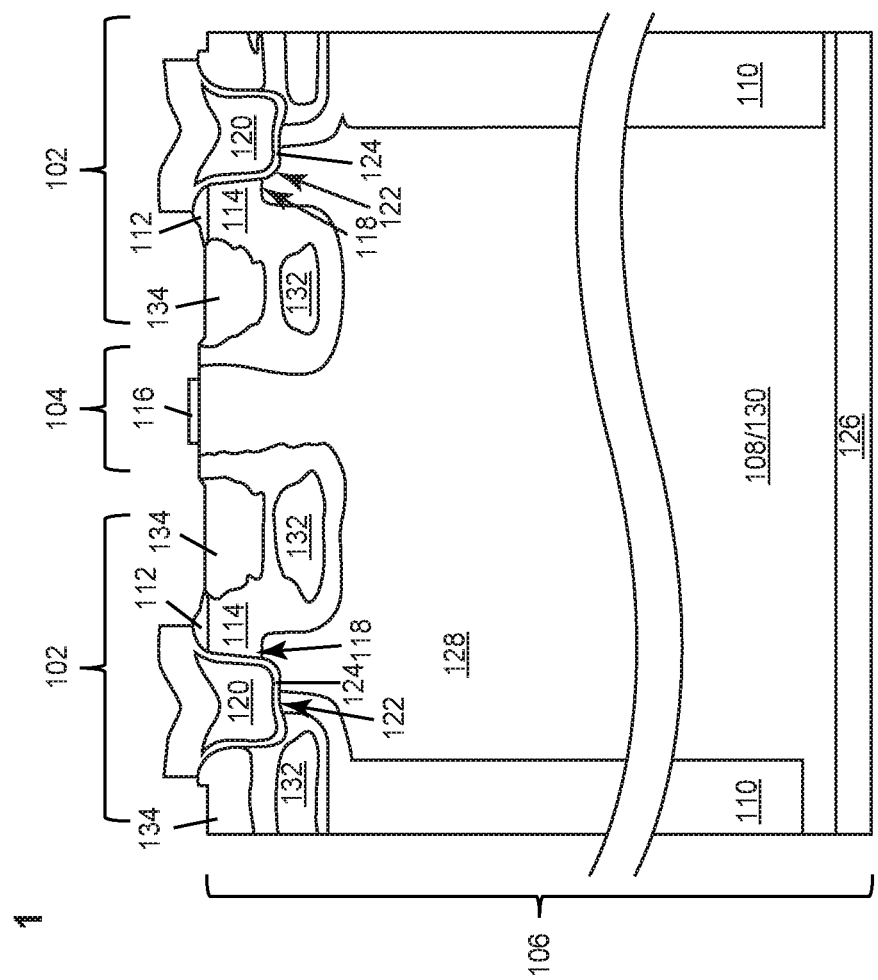
Figure 12A:
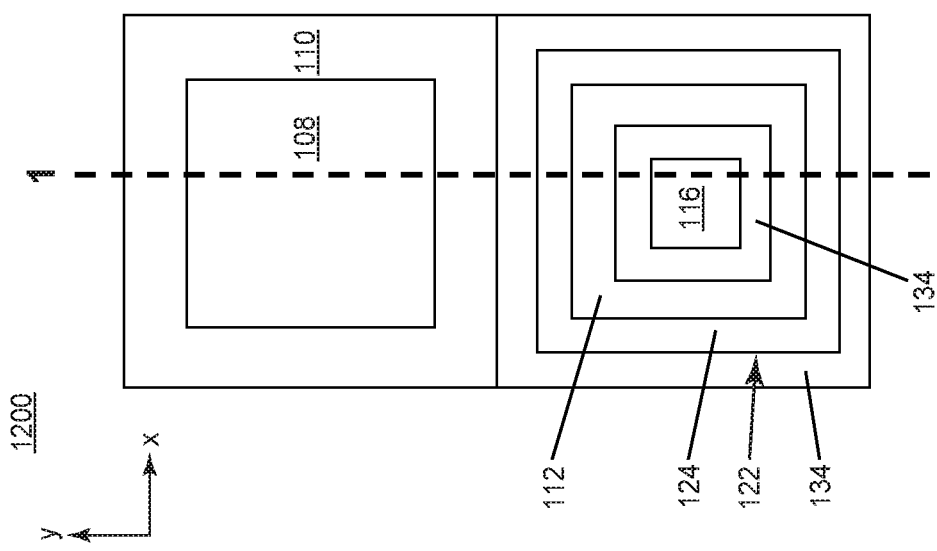

FIG. 12A illustrates a partial top-down plan view of another embodiment of a semiconductor device 1200 having a transistor structure 102 and a Schottky diode structure 104 integrated in the same semiconductor substrate 106. The transistor structure 102 and the Schottky diode structure 104 are part of the same device cell, and the semiconductor device 1200 has 10s, 100s, 1000s or even more of the device cells. A single device cell is shown in FIG. 12A for each of illustration.

The top-down plan view in FIG. 12A shows oppositely doped semiconductor regions 108, 110 of the superjunction structure side-by-side with the device cell only for ease of illustration. In reality, the oppositely doped semiconductor regions 108, 110 of the superjunction structure are formed in the semiconductor substrate 106 below the source and body regions 112, 114 of the transistor structure 102 and below the Schottky metal region 116 of the Schottky diode structure 104. FIG. 12B is a cross-sectional view of the semiconductor device 1200 taken along the line labeled '1' in FIG. 12A.

According to the embodiment shown in FIGS. 12A and 12B, the transistor structure 102 of the illustrated device cell has a quadratic shape and the Schottky metal region 116 of the Schottky diode structure 104 which forms part of the device cell is disposed at the center of the device cell. In quadratic cells, a connection is provided at the top of each gate trench to the gate electrodes 120. This connection is not shown in FIGS. 12 and 12B for ease of illustration.

FIG. 13A illustrates a partial top-down plan view of another embodiment of a semiconductor device 1300 having a transistor structure 102 and a Schottky diode structure 104 integrated in the same semiconductor substrate 106. FIG. 13B is a cross-sectional view of the semiconductor device 1300 taken along the line labeled '1' in FIG. 13A.

The embodiment shown in FIGS. 13A and 13B is similar to the embodiment illustrated in FIGS. 12A and 12B. Different, however, the region 110 of the second conductivity type of the superjunction structure is disposed at the center of the device cell. The gate trench 122 defines the periphery of the device cell. If a larger diode current density is needed, the Schottky metal region 116 may be positioned outside the device cell.

Figures 14A, 14B:
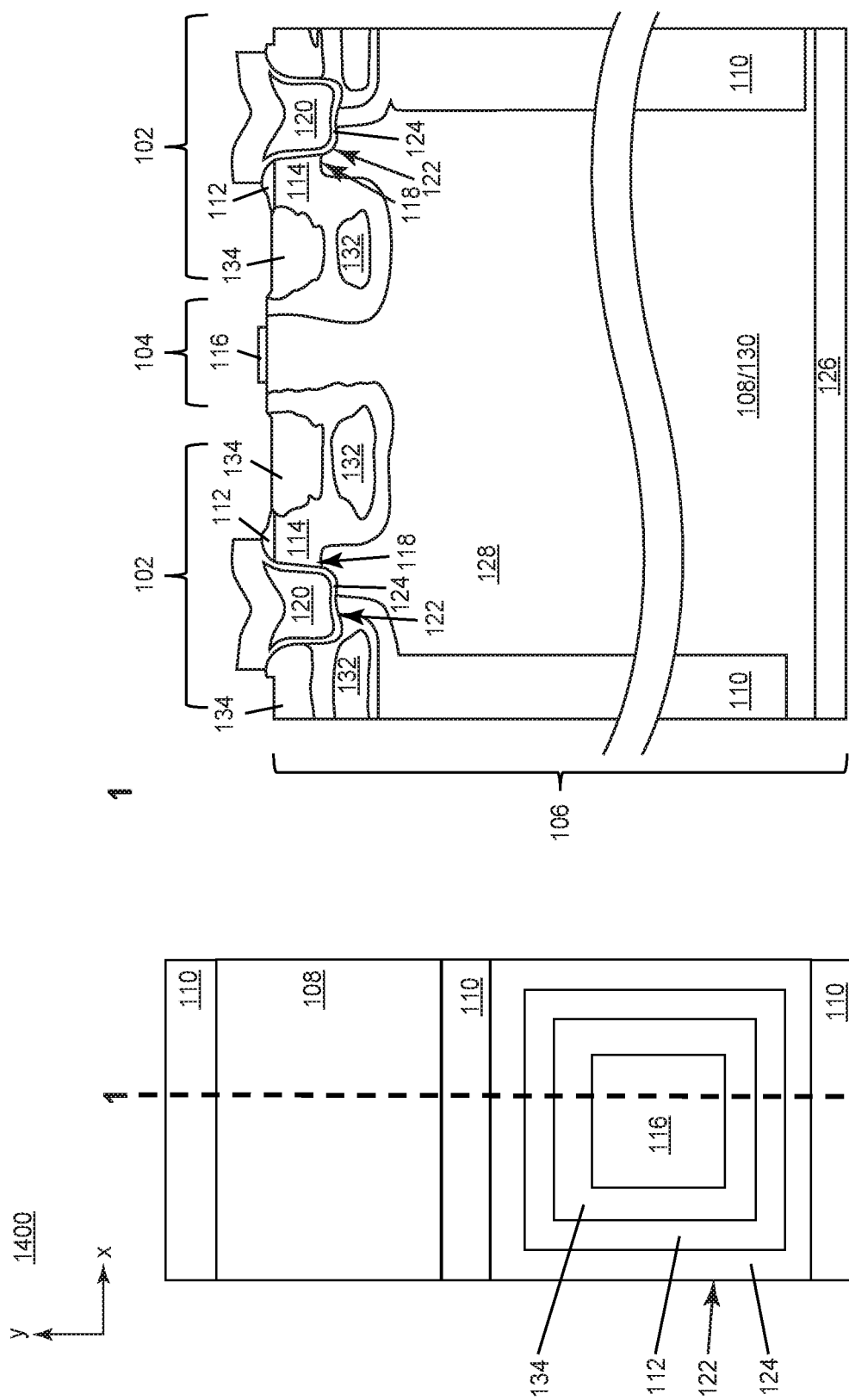

FIG. 14A illustrates a partial top-down plan view of another embodiment of a semiconductor device 1400 having a transistor structure 102 and a Schottky diode structure 104 integrated in the same semiconductor substrate 106. FIG. 14B is a cross-sectional view of the semiconductor device 1400 taken along the line labeled '1' in FIG. 14A.

The embodiment shown in FIGS. 14A and 14B is similar to the embodiment illustrated in FIGS. 12A and 12B. Different, however, the oppositely doped semiconductor regions 108, 110 of the superjunction structure are stripe shaped.

FIG. 15A illustrates a partial top-down plan view of another embodiment of a semiconductor device 1500 having a transistor structure 102 and a Schottky diode structure 104 integrated in the same semiconductor substrate 106. FIG. 15B is a cross-sectional view of the semiconductor device 1500 taken along the line labeled '1' in FIG. 15A.

The embodiment shown in FIGS. 15A and 15B is similar to the embodiment illustrated in FIGS. 13A and 13B. Different, however, the Schottky metal region 116 of the Schottky diode structure 104 which forms part of the device cell is disposed at the periphery of the device cell instead of the cell center. The source region 112 is shown as being formed along both the inner and outer sidewalls of the gate trench 122 in FIGS. 15A and 15B, but instead may be disposed along just the inner sidewall or just the outer sidewall of the gate trench 122.

Figures 16A, 16B:
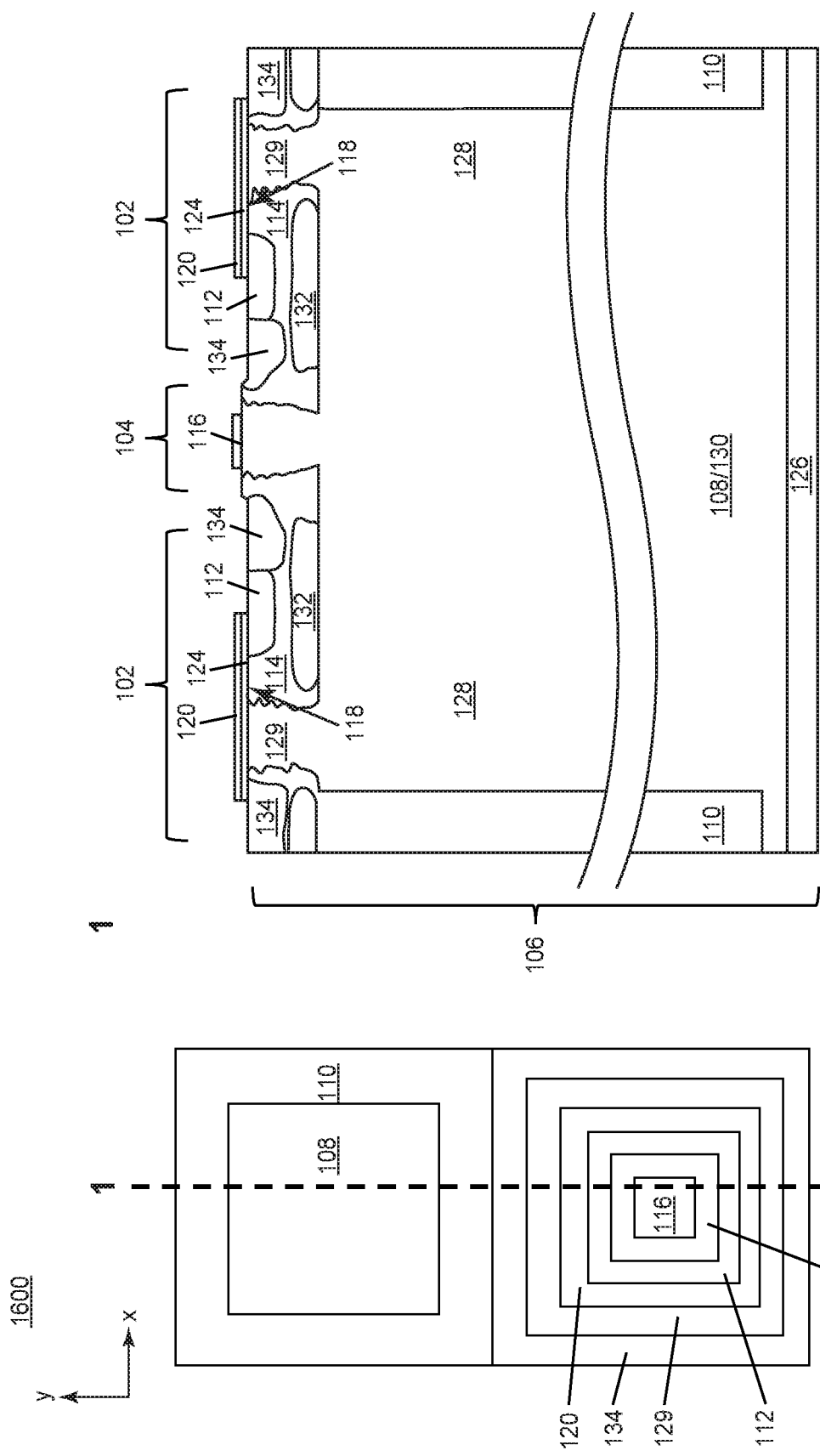

FIG. 16A illustrates a partial top-down plan view of another embodiment of a semiconductor device 1600 having a transistor structure 102 and a Schottky diode structure 104 integrated in the same semiconductor substrate 106. FIG. 16B is a cross-sectional view of the semiconductor device 1600 taken along the line labeled '1' in FIG. 16A.

The embodiment shown in FIGS. 16A and 16B is similar to the embodiment illustrated in FIGS. 12A and 12B. Different, however, the transistor structure 102 included in the device cell is a planar gate device with the gate electrode 120 disposed above and insulated from the semiconductor substrate 106 by the gate dielectric 124. As explained above in connection with FIGS. 2 and 3, current flows horizontally from the source 112 through the channel region 118 which forms in the body 114 to a current spread region 129 of the same conductivity type as the source 112, and then vertically to the drain/collector 126 through the drift zone 128. In FIGS. 16A and 16B, the gate dielectric 124 is shown laterally (horizontally) extending over part of the current spread region 129 and terminating before reaching the adjacent contact region 134. However, the gate dielectric 124 may laterally extend over the current spread region 129 and over all or part of the adjacent contact region 134.

Figures 17A, 17B:
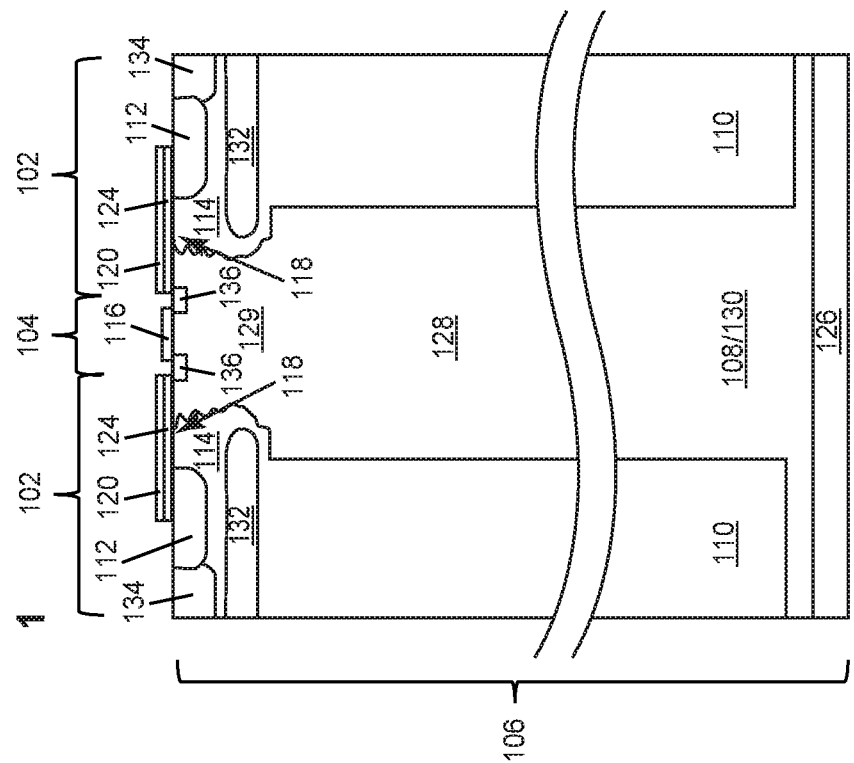

FIG. 17A illustrates a partial top-down plan view of another embodiment of a semiconductor device 1700 having a transistor structure 102 and a Schottky diode structure 104 integrated in the same semiconductor substrate 106. FIG. 17B is a cross-sectional view of the semiconductor device 1700 taken along the line labeled '1' in FIG. 17A.

The embodiment shown in FIGS. 17A and 17B is similar to the embodiment illustrated in FIGS. 16A and 16B. Different, however, the position of the source region 112 and the current spread region 129 are reversed. Accordingly, the source region 112 is disposed closer to the periphery of the device cell than the current spread region 129. The horizontal component of the current flow is inward toward the center of the device cell to the current spread region 129, and then vertically to the drain/collector 126 through the drift zone 128.

FIG. 18A illustrates a partial top-down plan view of another embodiment of a semiconductor device 1800 having a transistor structure 102 and a Schottky diode structure 104 integrated in the same semiconductor substrate 106. FIG. 18B is a cross-sectional view of the semiconductor device 1800 taken along the line labeled '1' in FIG. 18A.

The embodiment shown in FIGS. 18A and 18B is similar to the embodiment illustrated in FIGS. 16A and 16B. Different, however, the Schottky metal region 116 of the Schottky diode structure 104 which forms part of the device cell is disposed at the periphery of the device cell instead of the cell center. The region 110 of the second conductivity type of the superjunction structure also is disposed at the center of the device cell. In FIGS. 17A-17B and 18A-18B, the gate dielectric 124 is shown laterally (horizontally) extending over part of the current spread region 129 and terminating before reaching the adjacent Schottky metal region 116. However, the gate dielectric 124 may laterally extend over the current spread region 129 and over all or part of the adjacent Schottky metal region 116. In this case, dielectric and metal share the same n-region 129 without a p-region in between. However, a small p-region 136 may be formed close to the surface that separates the gate dielectric 124 and the adjacent Schottky metal region 116.

For each of the quadratic cell embodiments illustrated in FIGS. 12A through 18B, the regions 110 of the second conductivity type of the superjunction structure may have a uniform width or a width that changes over depth. For example, the regions 110 of the second conductivity type of the superjunction structure may widen in a direction heading towards the drain/collector 126, e.g., similar to what is shown in FIGS. 3 and 4. In addition or alternatively, the depth of the shielding regions 132 may be adapted for optimal shielding of the gate dielectric 124. In addition or alternatively, any of the quadratic cell layouts may instead be hexagonal shaped.

Figure 19B:
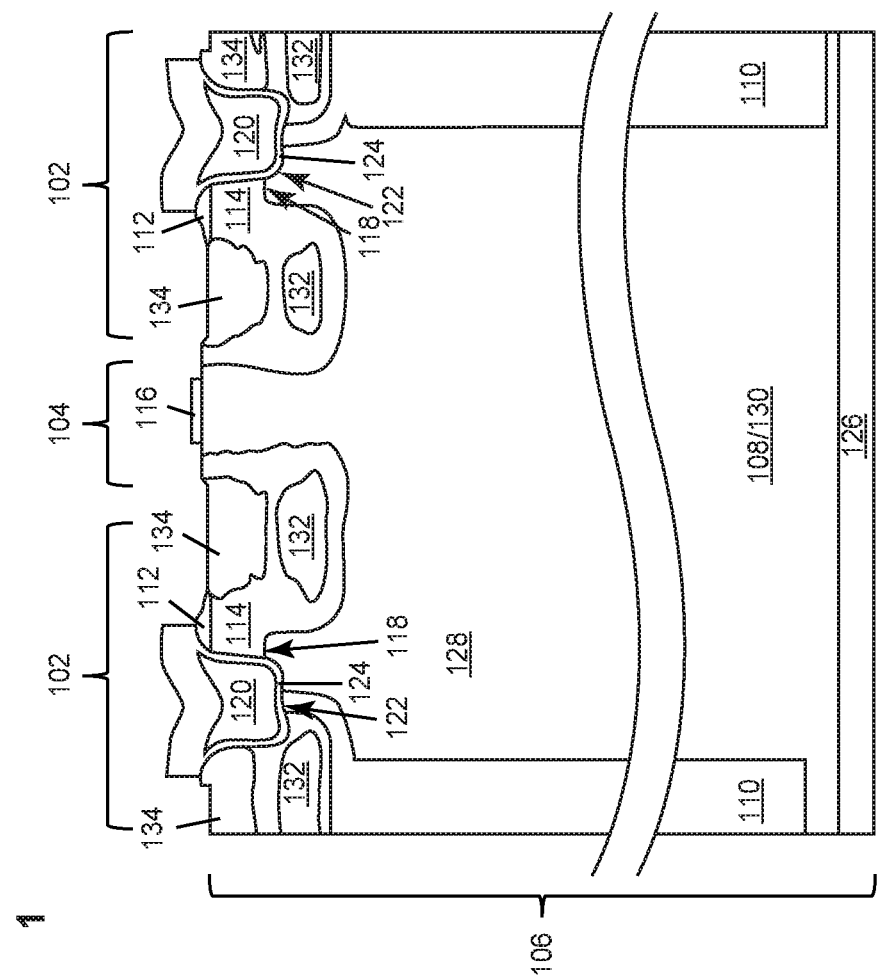
Figure 19A:
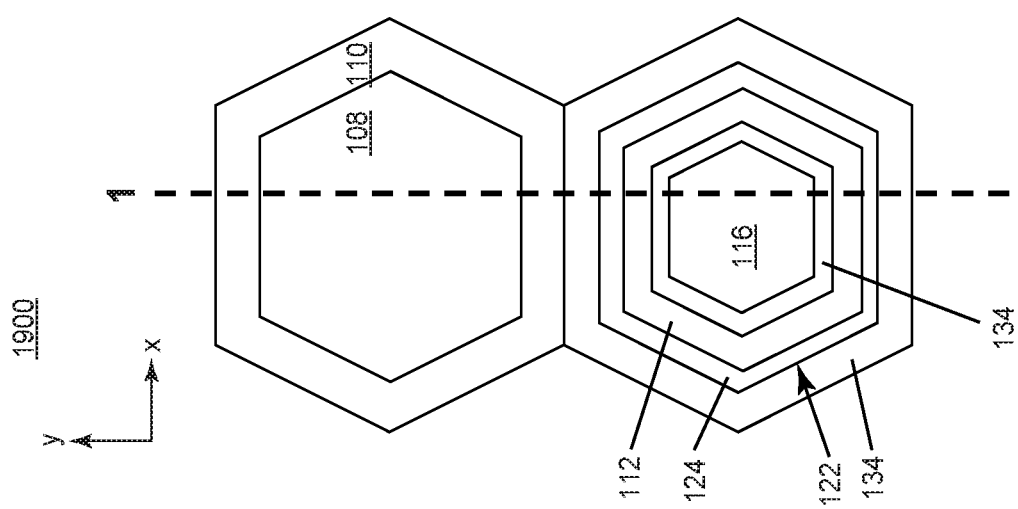

FIG. 19A illustrates a partial top-down plan view of another embodiment of a semiconductor device 1900 having a transistor structure 102 and a Schottky diode structure 104 integrated in the same semiconductor substrate 106. FIG. 19B is a cross-sectional view of the semiconductor device 1900 taken along the line labeled '1' in FIG. 19A.

The embodiment shown in FIGS. 19A and 19B is similar to the embodiment illustrated in FIGS. 12A and 12B. Different, however, the transistor structure 102 included in the device cell has a hexagonal shape instead of a quadratic shape.

Although the present disclosure is not so limited, the following numbered examples demonstrate one or more aspects of the disclosure.

Example 1. A semiconductor device, comprising: a transistor and a Schottky diode integrated in a semiconductor substrate; and a superjunction structure comprising alternating regions of n-type and p-type semiconductor material formed in the semiconductor substrate below a source and a body of the transistor and below a Schottky metal region of the Schottky diode, wherein a channel region that forms in the body of the transistor and the Schottky metal region are interconnected by n-type semiconductor material of the semiconductor substrate without interruption by the p-type regions of the superjunction structure, wherein the n-type semiconductor material that interconnects the channel region and the Schottky metal region comprises the n-type regions of the superjunction structure.

Example 2. The semiconductor device of example 1, wherein the semiconductor substrate is a SiC substrate.

Example 3. The semiconductor device of example 1 or 2, wherein the transistor is a trench gate transistor having a gate electrode disposed in a plurality of trenches formed in the semiconductor substrate.

Example 4. The semiconductor device of any of example 1 or 2, wherein the transistor is a planar gate transistor having a gate electrode disposed above and insulated from the semiconductor substrate.

Example 5. A semiconductor device, comprising: a plurality of device cells formed in a semiconductor substrate, each device cell including a transistor structure and a Schottky diode structure; and a superjunction structure comprising alternating regions of a first conductivity type and of a second conductivity type formed in the semiconductor substrate, wherein for each transistor structure, a channel region of the transistor structure and a Schottky metal region of an adjacent one of the Schottky diode structures are interconnected by semiconductor material of the first conductivity type without interruption by any of the regions of the second conductivity type of the superjunction structure, the semiconductor material of the first conductivity type comprising one or more of the regions of the first conductivity type of the superjunction structure.

Example 6. The semiconductor device of example 5, wherein the transistor structures are stripe shaped, and wherein the regions of the first conductivity type of the superjunction structure are stripe shaped.

Example 7. The semiconductor device of example 6, wherein the stripe-shaped regions of the first conductivity type of the superjunction structure run parallel with the stripe-shaped transistor structures.

Example 8. The semiconductor device of example 7, wherein for each stripe-shaped transistor structure: a source region of the stripe-shaped transistor structure is interrupted by at least one of the Schottky diode structures along a length of the stripe-shaped transistor structure; and a single one of the stripe-shaped regions of the first conductivity type of the superjunction structure is disposed below the source region of the stripe-shaped transistor structure and interconnects the channel region of the stripe-shaped transistor structure and the Schottky metal region of the at least one Schottky diode structure without interruption by any of the regions of the second conductivity type of the superjunction structure.

Example 9. The semiconductor device of example 7, wherein for each stripe-shaped transistor structure: at least one of the Schottky diode structures laterally adjoins the stripe-shaped transistor structure; a source region of the stripe-shaped transistor structure runs uninterrupted along a length of the stripe-shaped transistor structure and is separated from the Schottky metal region of the at least one laterally adjoining Schottky diode structure by a gate trench; a first one of the stripe-shaped regions of the second conductivity type of the superjunction structure is interposed between the source region and the Schottky metal region of the at least one laterally adjoining Schottky diode structure; a first one of the stripe-shaped regions of the first conductivity type of the superjunction structure is disposed below the source region; a second one of the stripe-shaped regions of the first conductivity type of the superjunction structure is disposed below the Schottky metal region of the at least one laterally adjoining Schottky diode structure; and the first one and the second one of the stripe-shaped regions of the first conductivity type of the superjunction structure interconnect the channel region of the stripe-shaped transistor structure and the Schottky metal region of the at least one laterally adjoining Schottky diode structure without interruption by the first one of the regions of the second conductivity type of the superjunction structure.

Example 10. The semiconductor device of example 9, wherein the first one of the regions of the second conductivity type of the superjunction structure is stripe shaped.

Example 11. The semiconductor device of any of examples 6 through 10, wherein the stripe-shaped regions of the first conductivity type of the superjunction structure run transverse to the stripe-shaped transistor structures.

Example 12. The semiconductor device of example 11, wherein for each stripe-shaped transistor structure: at least one of the Schottky diode structures laterally adjoins the stripe-shaped transistor structure; a source region of the stripe-shaped transistor structure runs uninterrupted along a length of the stripe-shaped transistor structure and is separated from the Schottky metal region of the at least one laterally adjoining Schottky diode structure by a gate trench; and the stripe-shaped regions of the first conductivity type of the superjunction structure interconnect the channel region of the stripe-shaped transistor structure and the Schottky metal region of the at least one laterally adjoining Schottky diode structure without interruption by the regions of the second conductivity type of the superjunction structure.

Example 13. The semiconductor device of example 12, wherein the regions of the second conductivity type of the superjunction structure are stripe shaped.

Example 14. The semiconductor device of example 12 or 13, wherein along a length of the stripe-shaped regions of the first conductivity type of the superjunction structure, adjacent ones of the stripe-shaped regions of the first conductivity type of the superjunction structure are interconnected by connecting regions of the first conductivity type which extend through the regions of the second conductivity type of the superjunction structure in a direction transverse to the lengthwise extension of the stripe-shaped regions of the first conductivity type of the superjunction structure, and wherein the connecting regions of the first conductivity type are in vertical contact with a body region of the stripe-shaped transistor structures.

Example 15. The semiconductor device of example 14, wherein the regions of the second conductivity type of the superjunction structure are stripe shaped, and wherein the stripe-shaped regions of the second conductivity type of the superjunction structure extend deeper into the semiconductor substrate than the connecting regions of the first conductivity type and are uninterrupted by the connecting regions of the first conductivity type below a termination point of the connecting regions of the first conductivity type.

Example 16. The semiconductor device of example 14 or 15, wherein the connecting regions of the first conductivity type extend deeper into the semiconductor substrate than the regions of the second conductivity type of the superjunction structure such that each region of the second conductivity type of the superjunction structure is segmented into a plurality of laterally spaced-apart pillars along the lengthwise extension of the stripe-shaped regions of the first conductivity type of the superjunction structure.

Example 17. The semiconductor device of any of examples 11 through 16, wherein for each stripe-shaped transistor structure: a source region of the stripe-shaped transistor structure is disposed along opposing sides of a gate trench; and the stripe-shaped regions of the first conductivity type of the superjunction structure are disposed below the source region of the stripe-shaped transistor structure and interconnect the channel region of the stripe-shaped transistor structure and the Schottky metal region of the at least one Schottky diode structure without interruption by any of the regions of the second conductivity type of the superjunction structure.

Example 18. The semiconductor device of example 17, wherein the regions of the second conductivity type of the superjunction structure extend to a drain or collector of the semiconductor device at a side of the semiconductor substrate opposite the source regions of the stripe-shaped transistor structures.

Example 19. The semiconductor device of any of examples 6 through 18, wherein source regions of the stripe-shaped transistor structures have a larger dimension measured along a lengthwise extension of the stripe-shaped transistor structures than the Schottky metal regions of the Schottky diode structures.

Example 20. The semiconductor device of example 5, wherein the device cells have a quadratic or hexagonal shape.

Terms such as "first", "second", and the like, are used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor device, comprising:
   a transistor and a Schottky diode integrated in a wide-bandgap semiconductor substrate; and
   a superjunction structure comprising alternating regions of n-type and p-type semiconductor material formed in the wide-bandgap semiconductor substrate below a source and a body of the transistor and below a Schottky metal region of the Schottky diode,
   wherein a channel region that forms in the body of the transistor and the Schottky metal region are interconnected by n-type semiconductor material of the wide-bandgap semiconductor substrate without interruption by the p-type regions of the superjunction structure,
   wherein the n-type semiconductor material that interconnects the channel region and the Schottky metal region comprises the n-type regions of the superjunction structure.

2. The semiconductor device of claim 1, wherein the wide-bandgap semiconductor substrate is a SiC substrate.

3. The semiconductor device of claim 1, wherein the transistor is a trench gate transistor having a gate electrode disposed in a plurality of trenches formed in the wide-bandgap semiconductor substrate.

4. The semiconductor device of claim 1, wherein the transistor is a planar gate transistor having a gate electrode disposed above and insulated from the wide-bandgap semiconductor substrate.

5. A semiconductor device, comprising:
   a plurality of device cells formed in a wide-bandgap semiconductor substrate, each device cell including a transistor structure and a Schottky diode structure; and
   a superjunction structure comprising alternating regions of a first conductivity type and of a second conductivity type formed in the wide-bandgap semiconductor substrate,
   wherein for each transistor structure, a channel region of the transistor structure and a Schottky metal region of an adjacent one of the Schottky diode structures are interconnected by wide-bandgap semiconductor material of the first conductivity type without interruption by any of the regions of the second conductivity type of the superjunction structure, the wide-bandgap semiconductor material of the first conductivity type comprising one or more of the regions of the first conductivity type of the superjunction structure.

6. The semiconductor device of claim 5, wherein the transistor structures are stripe shaped, and wherein the regions of the first conductivity type of the superjunction structure are stripe shaped.

7. The semiconductor device of claim 6, wherein the stripe-shaped regions of the first conductivity type of the superjunction structure run parallel with the stripe-shaped transistor structures.

8. The semiconductor device of claim 7, wherein for each stripe-shaped transistor structure:
   a source region of the stripe-shaped transistor structure is interrupted by at least one of the Schottky diode structures along a length of the stripe-shaped transistor structure; and
   a single one of the stripe-shaped regions of the first conductivity type of the superjunction structure is disposed below the source region of the stripe-shaped transistor structure and interconnects the channel region of the stripe-shaped transistor structure and the Schottky metal region of the at least one Schottky diode structure without interruption by any of the regions of the second conductivity type of the superjunction structure.

9. The semiconductor device of claim 7, wherein for each stripe-shaped transistor structure:
at least one of the Schottky diode structures laterally adjoins the stripe-shaped transistor structure;
a source region of the stripe-shaped transistor structure runs uninterrupted along a length of the stripe-shaped transistor structure and is separated from the Schottky metal region of the at least one laterally adjoining Schottky diode structure by a gate trench;
a first one of the stripe-shaped regions of the second conductivity type of the superjunction structure is interposed between the source region and the Schottky metal region of the at least one laterally adjoining Schottky diode structure;
a first one of the stripe-shaped regions of the first conductivity type of the superjunction structure is disposed below the source region;
a second one of the stripe-shaped regions of the first conductivity type of the superjunction structure is disposed below the Schottky metal region of the at least one laterally adjoining Schottky diode structure; and
the first one and the second one of the stripe-shaped regions of the first conductivity type of the superjunction structure interconnect the channel region of the stripe-shaped transistor structure and the Schottky metal region of the at least one laterally adjoining Schottky diode structure without interruption by the first one of the regions of the second conductivity type of the superjunction structure.

10. The semiconductor device of claim 9, wherein the first one of the regions of the second conductivity type of the superjunction structure is stripe shaped.

11. The semiconductor device of claim 6, wherein the stripe-shaped regions of the first conductivity type of the superjunction structure run transverse to the stripe-shaped transistor structures.

12. The semiconductor device of claim 11, wherein for each stripe-shaped transistor structure:
at least one of the Schottky diode structures laterally adjoins the stripe-shaped transistor structure;
a source region of the stripe-shaped transistor structure runs uninterrupted along a length of the stripe-shaped transistor structure and is separated from the Schottky metal region of the at least one laterally adjoining Schottky diode structure by a gate trench; and
the stripe-shaped regions of the first conductivity type of the superjunction structure interconnect the channel region of the stripe-shaped transistor structure and the Schottky metal region of the at least one laterally adjoining Schottky diode structure without interruption by the regions of the second conductivity type of the superjunction structure.

13. The semiconductor device of claim 12, wherein the regions of the second conductivity type of the superjunction structure are stripe shaped.

14. The semiconductor device of claim 12, wherein along a length of the stripe-shaped regions of the first conductivity type of the superjunction structure, adjacent ones of the stripe-shaped regions of the first conductivity type of the superjunction structure are interconnected by connecting regions of the first conductivity type which extend through the regions of the second conductivity type of the superjunction structure in a direction transverse to the lengthwise extension of the stripe-shaped regions of the first conductivity type of the superjunction structure, and wherein the connecting regions of the first conductivity type are in vertical contact with a body region of the stripe-shaped transistor structures.

15. The semiconductor device of claim 14, wherein the regions of the second conductivity type of the superjunction structure are stripe shaped, and wherein the stripe-shaped regions of the second conductivity type of the superjunction structure extend deeper into the wide-bandgap semiconductor substrate than the connecting regions of the first conductivity type and are uninterrupted by the connecting regions of the first conductivity type below a termination point of the connecting regions of the first conductivity type.

16. The semiconductor device of claim 14, wherein the connecting regions of the first conductivity type extend deeper into the wide-bandgap semiconductor substrate than the regions of the second conductivity type of the superjunction structure such that each region of the second conductivity type of the superjunction structure is segmented into a plurality of laterally spaced-apart pillars along the lengthwise extension of the stripe-shaped regions of the first conductivity type of the superjunction structure.

17. The semiconductor device of claim 11, wherein for each stripe-shaped transistor structure:
a source region of the stripe-shaped transistor structure is disposed along opposing sides of a gate trench; and
the stripe-shaped regions of the first conductivity type of the superjunction structure are disposed below the source region of the stripe-shaped transistor structure and interconnect the channel region of the stripe-shaped transistor structure and the Schottky metal region of the at least one Schottky diode structure without interruption by any of the regions of the second conductivity type of the superjunction structure.

18. The semiconductor device of claim 17, wherein the regions of the second conductivity type of the superjunction structure extend to a drain or collector of the semiconductor device at a side of the wide-bandgap semiconductor substrate opposite the source regions of the stripe-shaped transistor structures.

19. The semiconductor device of claim 6, wherein source regions of the stripe-shaped transistor structures have a larger dimension measured along a lengthwise extension of the stripe-shaped transistor structures than the Schottky metal regions of the Schottky diode structures.

20. The semiconductor device of claim 5, wherein the device cells have a quadratic or hexagonal shape.

* * * * *